(12) United States Patent
Han et al.

(10) Patent No.: US 11,069,534 B2
(45) Date of Patent: Jul. 20, 2021

(54) METHOD OF MANUFACTURING SEMICONDUCTOR DEVICES AND SEMICONDUCTOR DEVICES

(71) Applicant: TAIWAN SEMICONDUCTOR MANUFACTURING CO., LTD., Hsinchu (TW)

(72) Inventors: Hui-An Han, Hsinchu (TW); Ding-I Liu, Hsinchu (TW); Yuh-Ta Fan, Shin Chu (TW); Kai-Shiung Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/653,313

(22) Filed: Oct. 15, 2019

(65) Prior Publication Data
US 2020/0135868 A1    Apr. 30, 2020

Related U.S. Application Data

(60) Provisional application No. 62/753,896, filed on Oct. 31, 2018.

(51) Int. Cl.
*H01L 21/3213*    (2006.01)
*H01L 29/40*    (2006.01)
(Continued)

(52) U.S. Cl.
CPC .. *H01L 21/32134* (2013.01); *H01L 21/28556* (2013.01); *H01L 21/28568* (2013.01); *H01L 21/3215* (2013.01); *H01L 29/401* (2013.01); *H01L 29/4916* (2013.01); *H01L 29/66795* (2013.01); *H01L 29/785* (2013.01)

(58) Field of Classification Search
CPC ......... H01L 21/28556; H01L 21/28568; H01L 21/32134; H01L 21/3215; H01L 21/44; H01L 21/46; H01L 21/47576; H01L 29/401; H01L 29/66795; H01L 29/785; H01L 29/7856; H01L 29/4916; H01L 21/3115; H01L 29/7855
See application file for complete search history.

(56) References Cited

U.S. PATENT DOCUMENTS 9,418,853 B1   8/2016   Wang et al.
10,049,940 B1   8/2018   Chen et al.
(Continued)

FOREIGN PATENT DOCUMENTS

JP    2010-153489 A    7/2010
JP    2017-103336 A    6/2017
(Continued)

*Primary Examiner* — Eduardo A Rodela
(74) *Attorney, Agent, or Firm* — McDermott Will & Emery LLP

(57) ABSTRACT

In a method of manufacturing a semiconductor device, a gate dielectric layer is formed over a channel region, a first conductive layer is formed over the gate dielectric layer, a protective layer is formed at a surface region of the first conductive layer, a metallic layer is formed by applying a metal containing gas on the protective layer, and the metallic layer is removed by a wet etching operation using a solution. The protective layer is resistant to the solution of the wet etching operation.

20 Claims, 26 Drawing Sheets

(51) Int. Cl.
    *H01L 29/49*         (2006.01)
    *H01L 29/78*         (2006.01)
    *H01L 21/285*       (2006.01)
    *H01L 21/3215*      (2006.01)
    *H01L 29/66*         (2006.01)

(56) References Cited

U.S. PATENT DOCUMENTS

| | | | |
|---|---|---|---|
| 2007/0145488 A1* | 6/2007 | Koyama | H01L 21/823835 |
| | | | 257/369 |
| 2013/0048606 A1* | 2/2013 | Mao | G03F 1/82 |
| | | | 216/67 |
| 2013/0078555 A1* | 3/2013 | Orihara | G03F 1/60 |
| | | | 430/5 |
| 2015/0031204 A1 | 1/2015 | Sasaki et al. | |
| 2015/0048296 A1* | 2/2015 | Park | H01L 27/228 |
| | | | 257/2 |
| 2015/0235954 A1* | 8/2015 | Chang | H01L 21/76862 |
| | | | 257/751 |
| 2017/0110444 A1* | 4/2017 | Shen | H01L 31/028 |
| 2017/0154785 A1 | 6/2017 | Yoshimizu et al. | |

FOREIGN PATENT DOCUMENTS

| | | |
|---|---|---|
| KR | 10-2015-0012202 A | 2/2015 |
| TW | 201539665 A | 10/2015 |
| TW | 201735190 A | 10/2017 |

\* cited by examiner

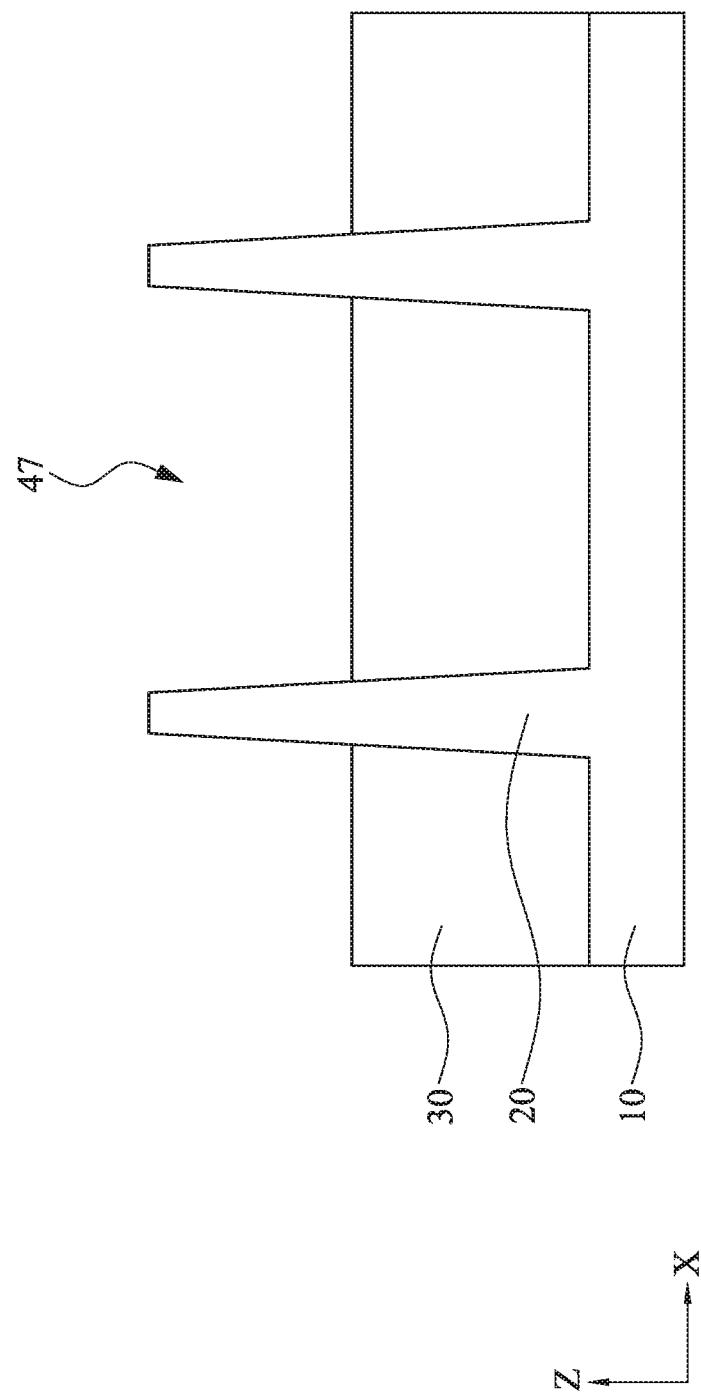

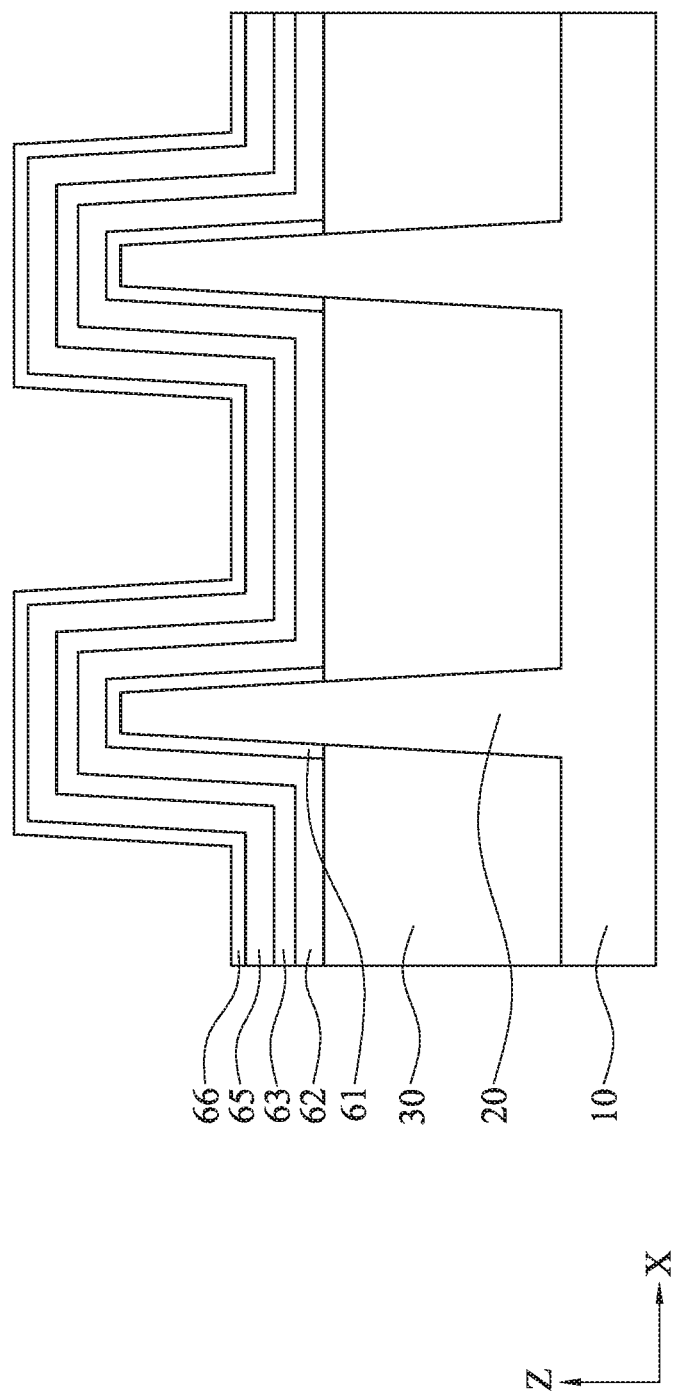

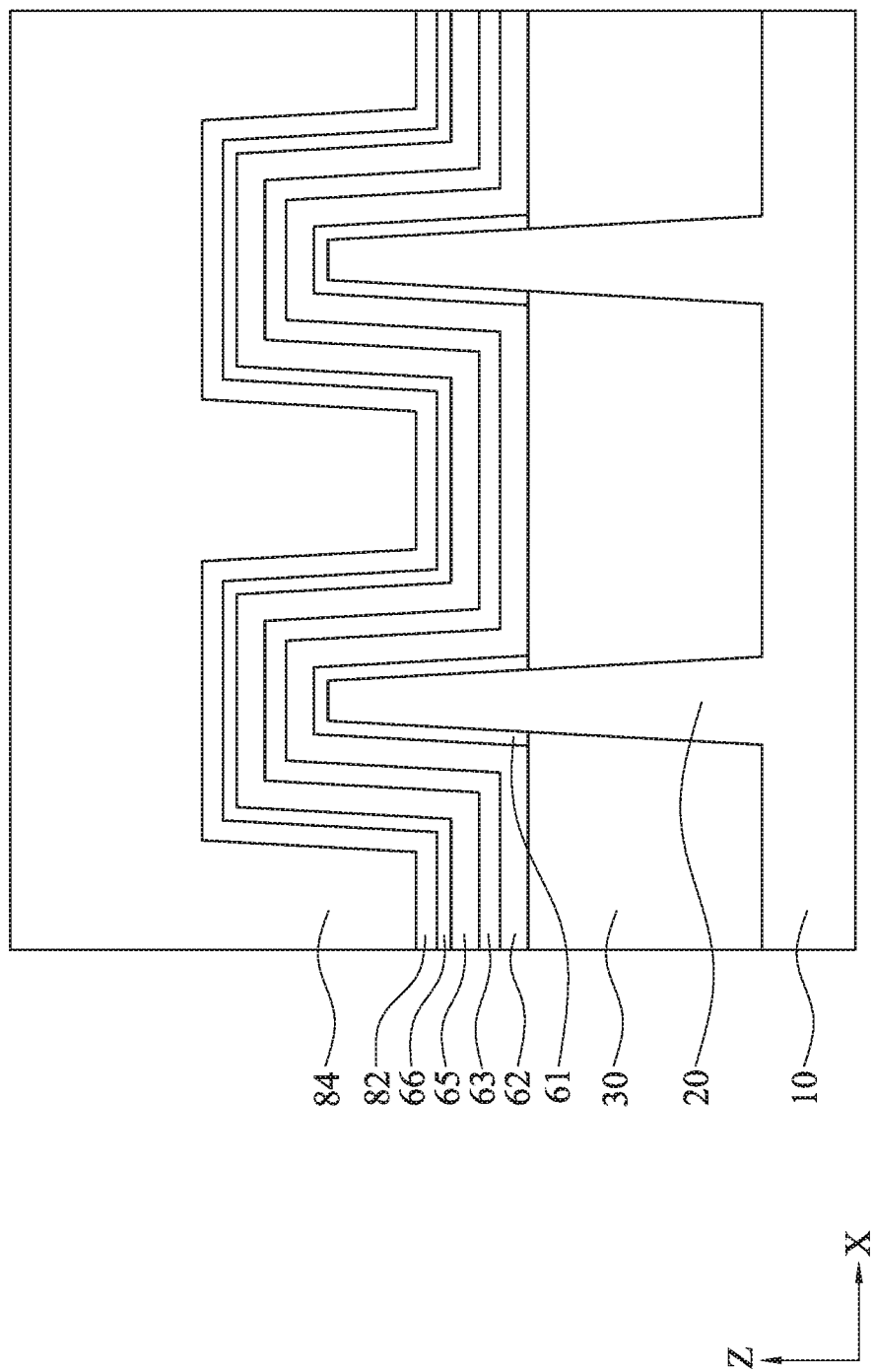

METHOD OF MANUFACTURING SEMICONDUCTOR DEVICES AND SEMICONDUCTOR DEVICES

RELATED APPLICATION

This application claims priority to U.S. Provisional Patent Application No. 62/753,896 filed Oct. 31, 2018, the entire contents of which are incorporated herein by reference.

BACKGROUND

With increasing down-scaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. Since FinFETs have a three-dimensional channel structure, ion implantation processes to the channel require extra care to reduce any geometrical effects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G and 3H show cross sectional views of various stages of a sequential manufacturing process of a semiconductor device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

Disclosed embodiments relate to a semiconductor device, in particular, a field effect transistor (FET) and its manufacturing method. The embodiments such as those disclosed herein are generally applicable not only to FinFETs but also to double-gate, surround-gate, omega-gate or gate-all-around (GAA) transistors, and/or nanowire transistors, or any suitable device having a metal gate structure.

Figure 1A:
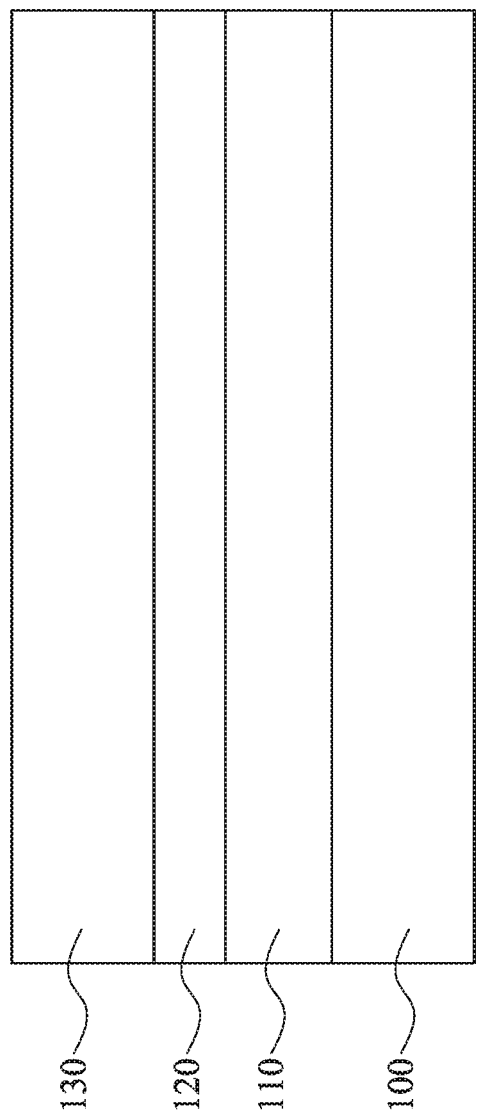
FIG. 1A shows a cross sectional view of a semiconductor device according to an embodiment of the present disclosure.

As shown in FIG. 1A, in some embodiments, a first conductive layer 110 is formed over an underlying layer 100. The under laying layer 100 is a dielectric layer, a semiconductor layer or a conductive (metal or metallic) layer in some embodiments. In some embodiments, the underlying layer 100 is a gate dielectric layer. A protective layer 120 is formed on the first conductive layer 110 and a second conductive layer 130 is further formed over the protective layer 120. The protective layer 120 has a function to prevent physical interaction (e.g., diffusion) and/or chemical reaction between the first conductive layer 110 and the second conductive layer 130. In some embodiments, the second conductive layer 130 is a part of a semiconductor device, and in other embodiments, the second conductive layer 130 is subsequently removed and does not remain in the semiconductor device.

In some embodiments, the protective layer 120 is a doped layer of the first conductive layer 110. The dopant includes one or more of boron, silicon, carbon and nitrogen. The dopants are introduced into the surface portion of the first conductive layer 110 by applying gas containing the dopants or implanting ions of the dopants into the surface portion. The source (precursor) gas for the gas application includes $B_2H_6$, silane ($SiH_4$), disilane ($Si_2H_6$), dichlorosilane ($SiH_2Cl_2$), hexachlorodisilane ($Si_2Cl_6$), $CF_4$, $CHF_3$, $NH_3$, and any other suitable gas. In some embodiments, the gas is applied to the surface of the first conductive layer 110 for 1 sec to 60 sec. In some embodiments, plasma containing the dopants is used. In some embodiments, the protective layer 120 is a polymer layer or a dielectric layer. In some embodiments, the protective layer 120 is removed after the second conductive layer 130 is removed.

In some embodiments, the first conductive layer 110 is a layer of Ti, TiN, TiAlC, Ta or TaN. In some embodiments, the second conductive layer 130 is a layer of W, Co, Ni or Mo. In other embodiments, the second conductive layer 130 is a layer of Ti, TiN, TiAlC, Ta or TaN. In certain embodiments, the first conductive layer 110 is TaN and the second conductive layer 130 is a W layer.

In some embodiments, the thickness of the protective layer 120 is thinner or greater than the first and/or second conductive layers 110 and 130, and is in a range from about 0.1 nm to about 10 nm. The uniformity in the thickness of the protective layer is in a range from about 1% to about 10% ((Max−Min)/Ave×100).

Figure 1B:
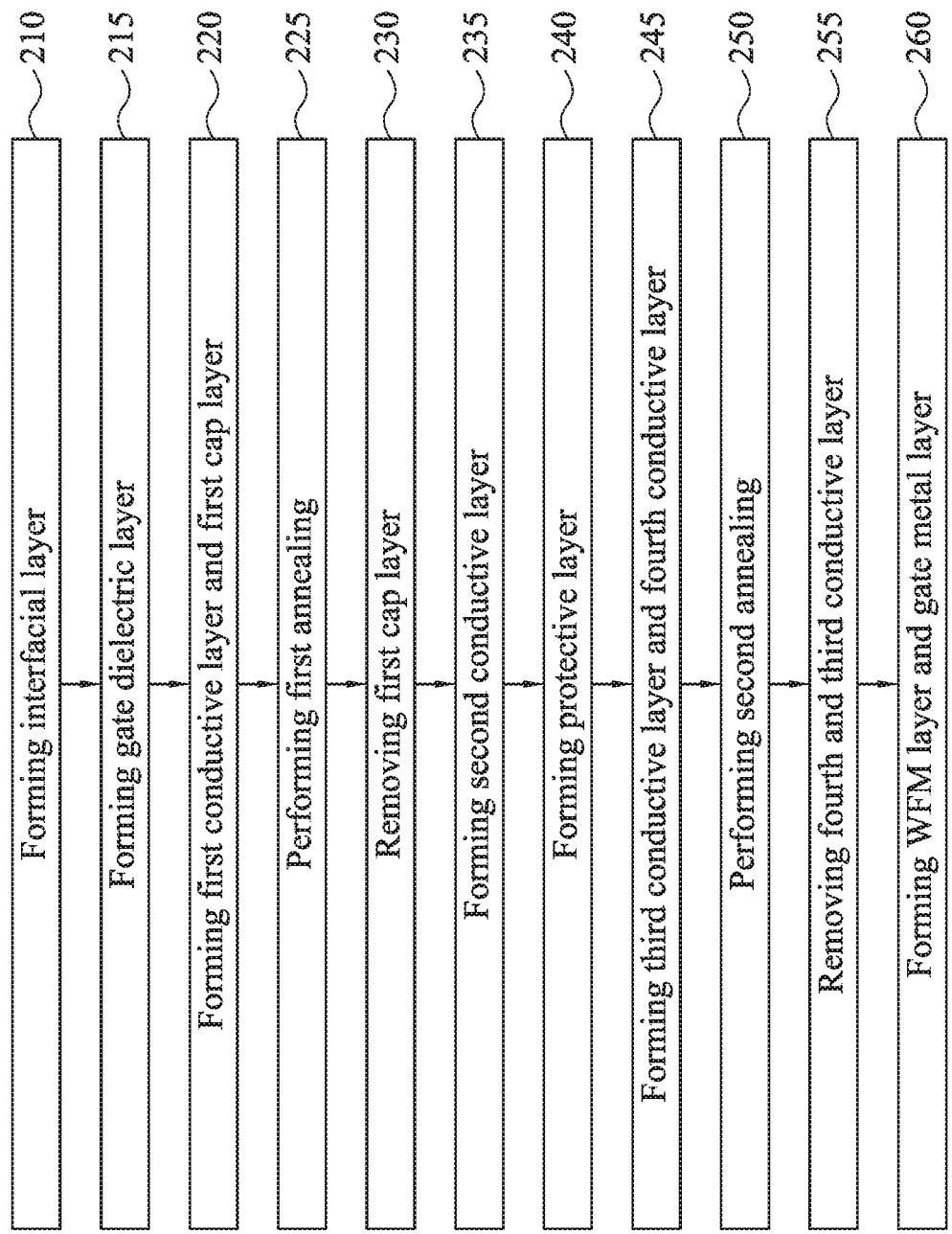
FIG. 1B shows a flow chart of manufacturing a semiconductor device according to an embodiment of the present disclosure.

FIG. 1B shows a flow chart of manufacturing a semiconductor device according to an embodiment of the present disclosure. FIGS. 2A-2H and 3A-3H show cross sectional view of manufacturing a semiconductor device according to an embodiment of the present disclosure. It is understood that in the sequential manufacturing process, one or more additional operations can be provided before, during, and after the stages shown in FIGS. 2A-3H, and some of the operations described below can be replaced or eliminated for additional embodiments of the method. The order of the operations/processes may be interchangeable. Materials, configurations, dimensions, processes and/or operations as described with respect to the foregoing embodiments may be employed in the following embodiment, and detailed description thereof may be omitted.

Figure 2A:
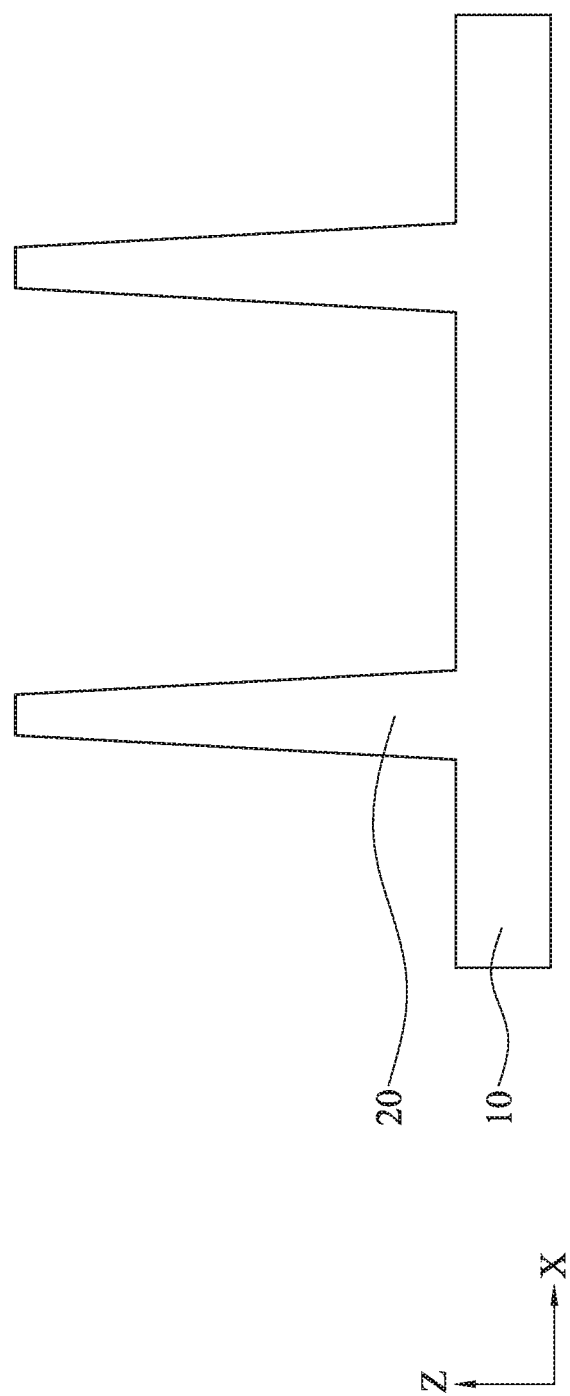
FIGS. 2A, 2B, 2C, 2D, 2E, 2F, 2G and 2H show cross sectional views of various stages of a sequential manufacturing process of a semiconductor device according to an embodiment of the present disclosure.

As shown in FIG. 2A, one or more fin structures 20 are fabricated over a substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments. The space between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

Figure 2B:
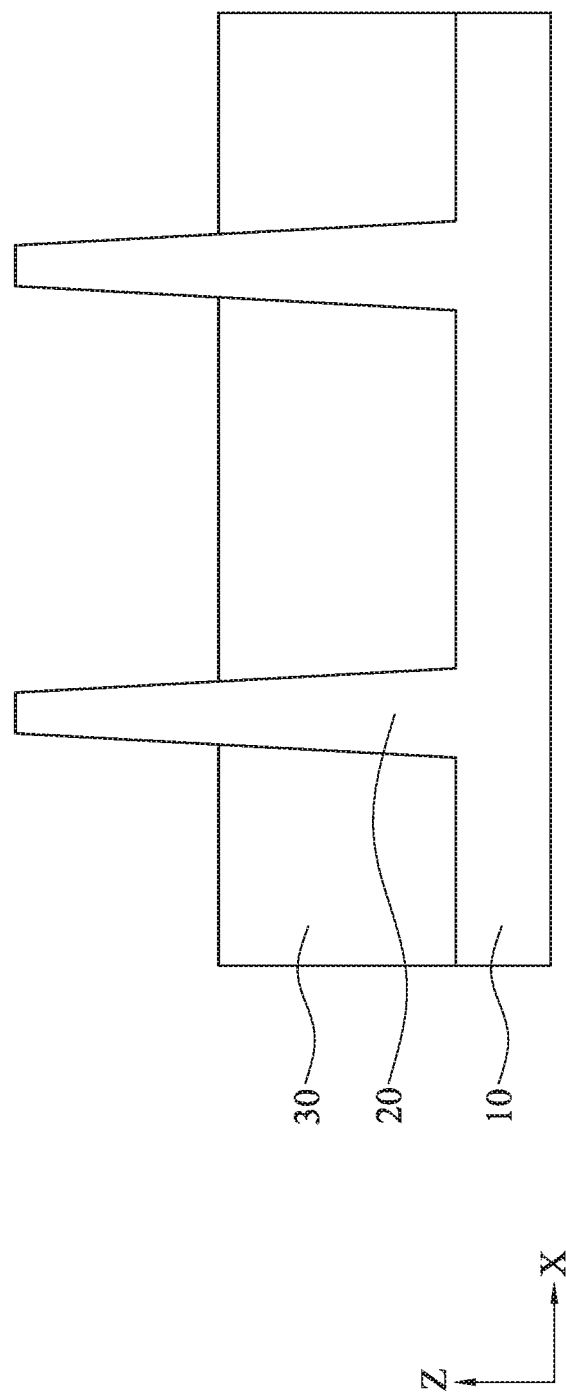

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30. The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 may be performed using a wet etching process, for example, by dipping the substrate in hydrofluoric acid (HF). In another embodiment, the partial removing of the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 2C:
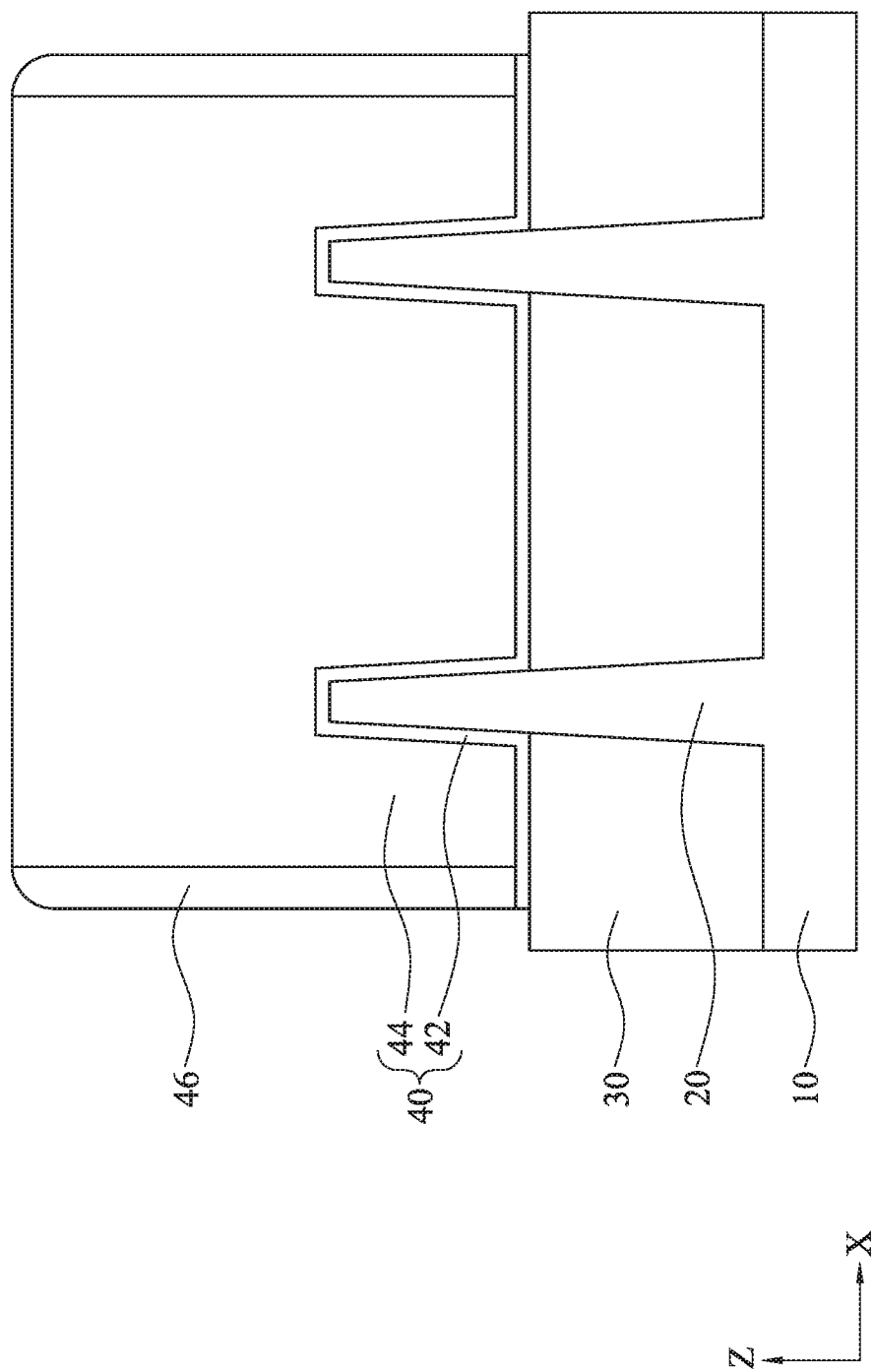

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 may be silicon oxide formed by CVD, PVD, ALD, e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 is a doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and may be in a range of about 7 nm to about 15 nm in certain embodiments.

Further, as shown in FIG. 2C, sidewall spacers 46 are formed on opposite side faces of the dummy gate structures 40. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Figure 2D:
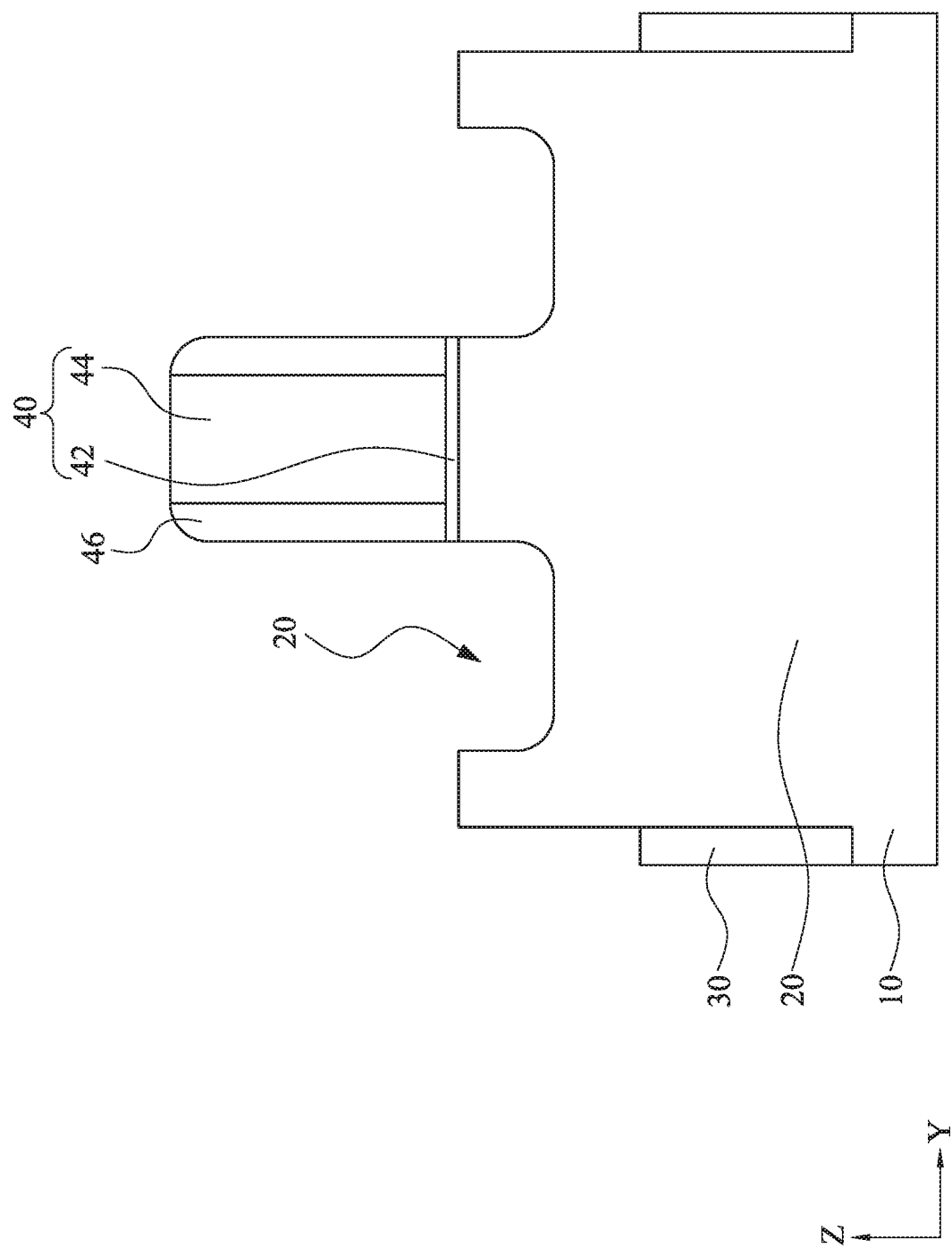
Figure 2E:
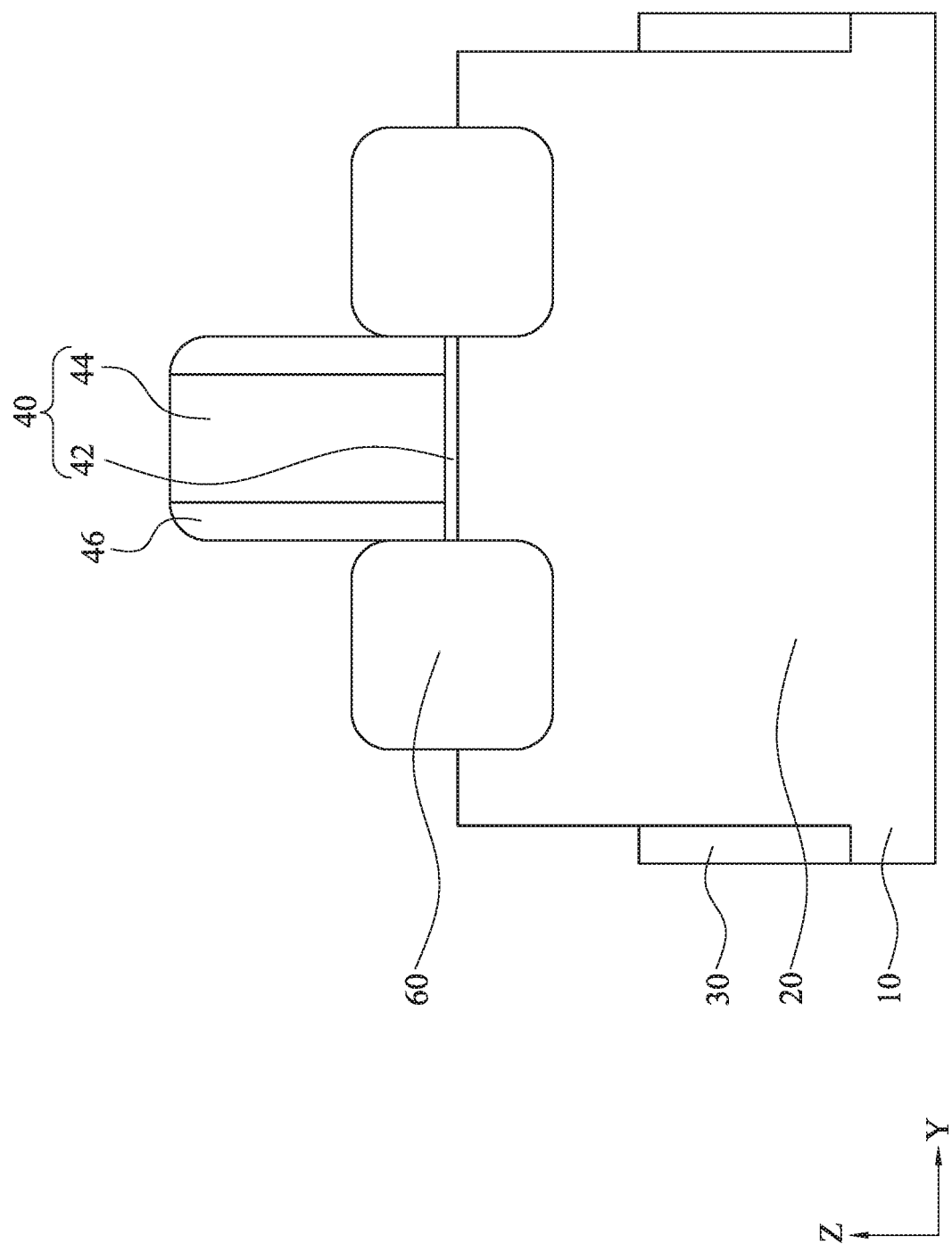

Subsequently, a source/drain region of the fin structure 20 not covered by the dummy gate structure 40 is etched down (recessed) to form a source/drain recess in some embodiments, as shown in FIG. 2D to form a recess 22. After the source/drain recess 22 is formed, one or more source/drain epitaxial layers 60 are formed in the source/drain recess 22, as shown in FIG. 2E. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe doped with B for a p-type FinFET, in the some embodiments. An amount of P (phosphorus) in the first epitaxial layer is in a range from about $1\times10^{18}$ atoms/$cm^3$ to about $1\times10^{20}$ atoms/$cm^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1\times10^{20}$ atoms/$cm^3$ to about $2\times10^{20}$ atoms/$cm^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer may include a SiP epitaxial layer. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/$cm^3$ to about $1\times10^{21}$ atoms/$cm^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$ and phosphorus source gas such as $PH_3$.

Figure 2F:
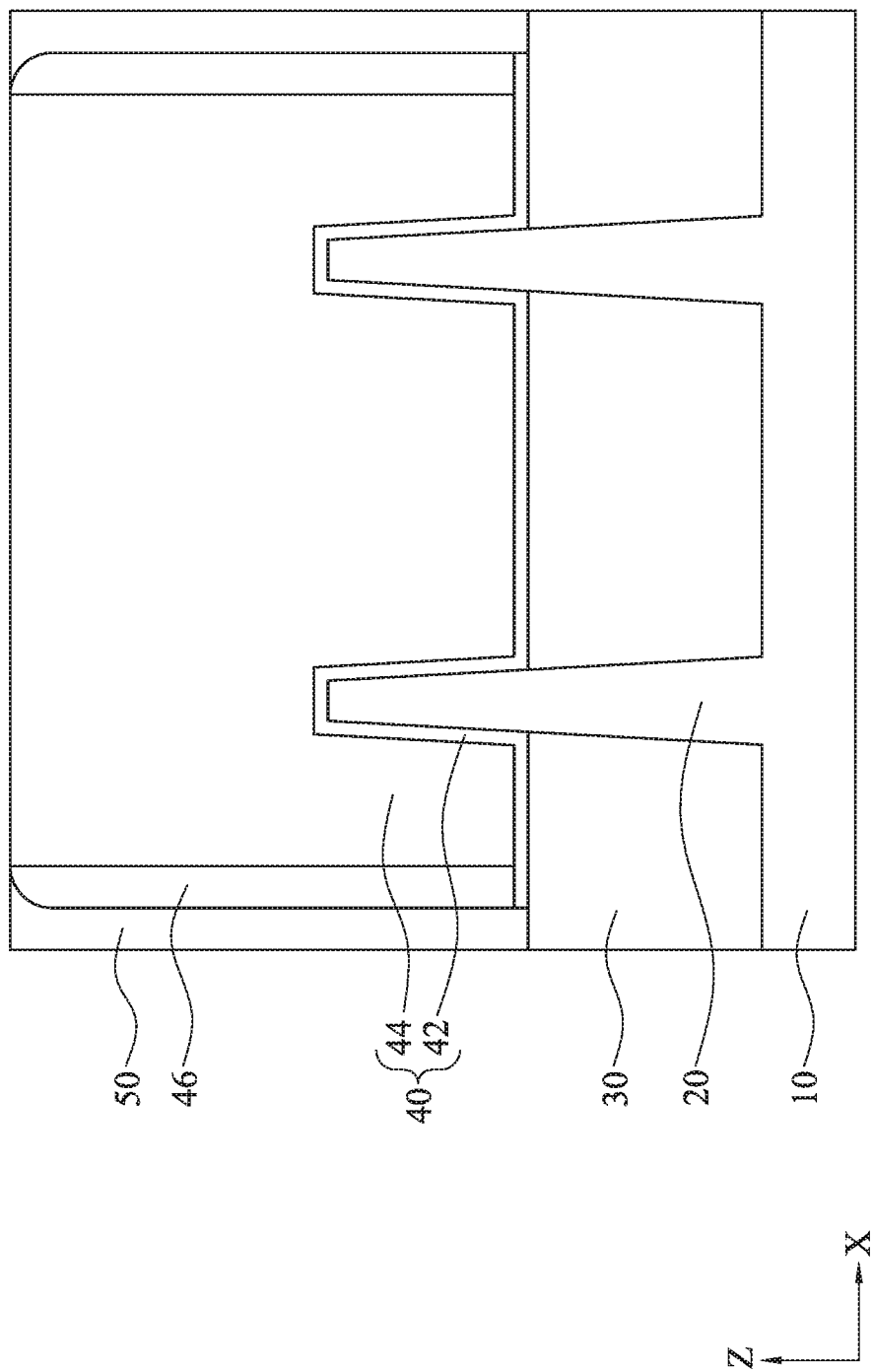
Figure 2G:
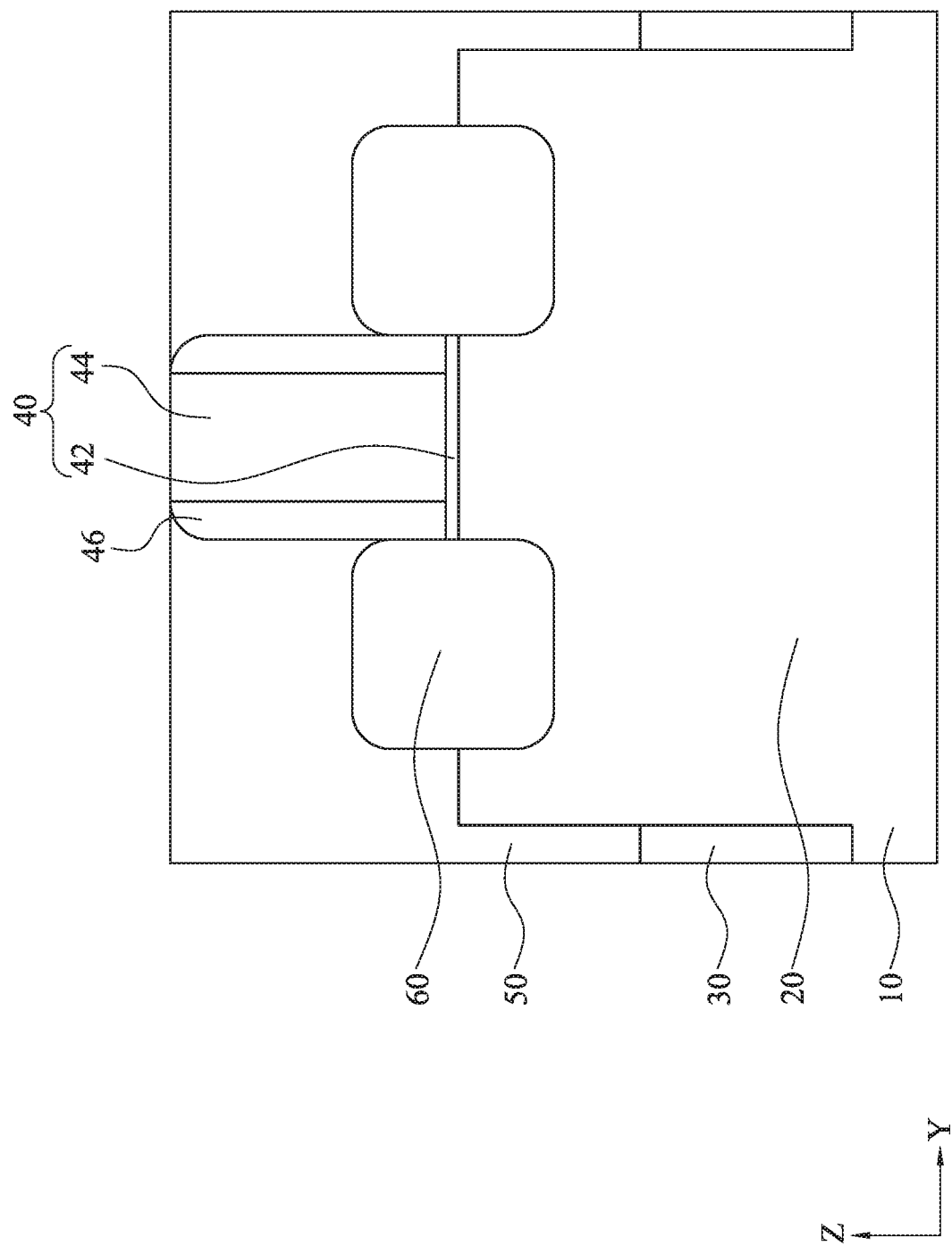

Then, as shown in FIGS. 2F and 2G, an interlayer dielectric (ILD) layer 50 is formed over the S/D epitaxial layer 60 and the dummy gate structure 40. The materials for the ILD layer 50 include compounds comprising Si, 0, C and/or H, such as silicon oxide, SiCOH and SiOC. Organic materials, such as polymers, may be used for the ILD layer 50.

After the ILD layer 50 is formed, a planarization operation, such as CMP, is performed, so that the top portion of the dummy gate electrode layer 44 is exposed, as shown in FIGS. 2F and 2G. In some embodiments, before the ILD layer 50 is formed, a contact etch stop layer, such as a silicon nitride layer or a silicon oxynitride layer, is formed.

Figure 2H:
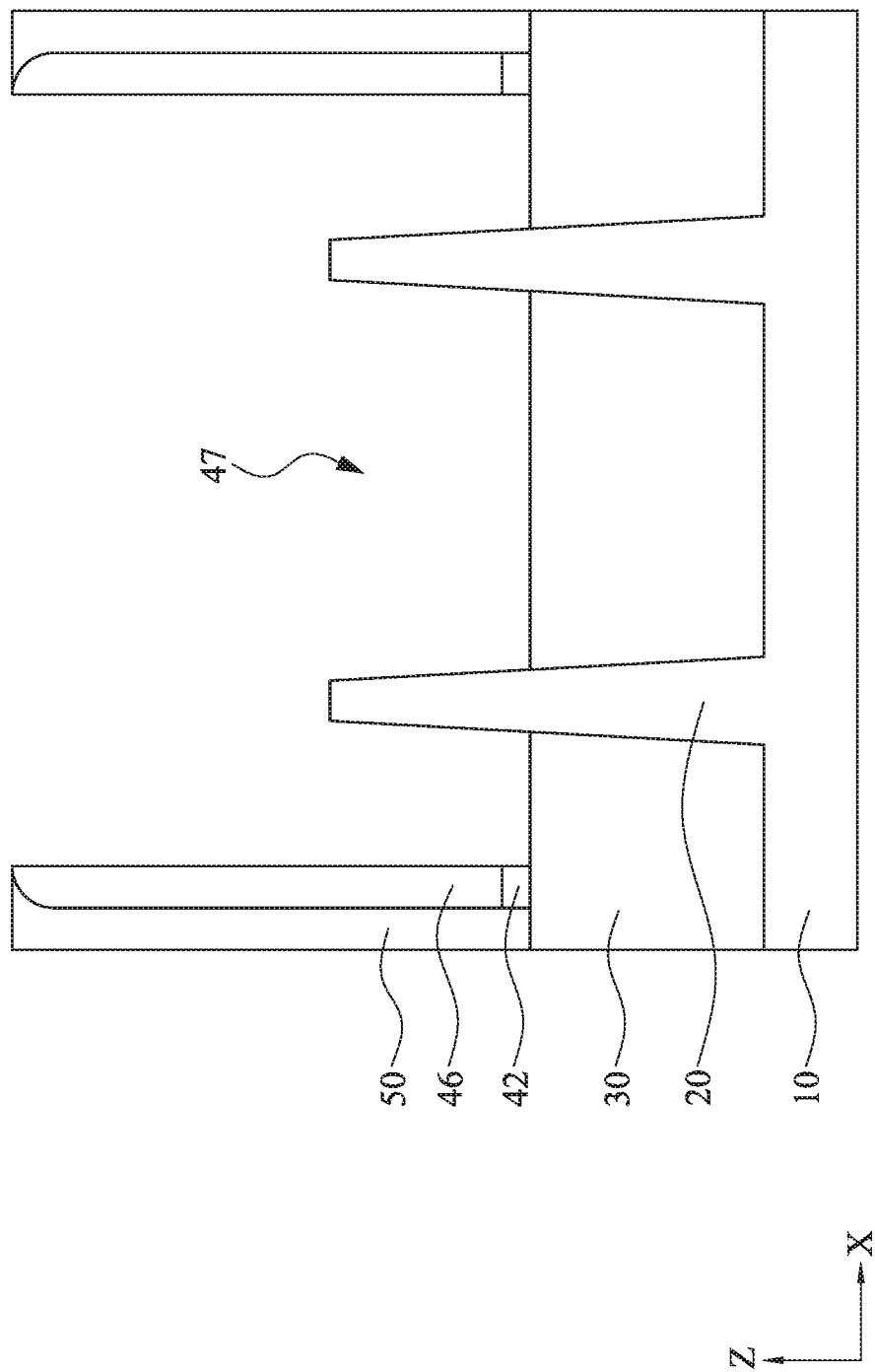

Then, the dummy gate electrode layer 44 and the dummy gate dielectric layer 42 are removed, thereby forming a gate space 47 as shown in FIG. 2H. The dummy gate structures can be removed using plasma dry etching and/or wet etching. When the dummy gate electrode layer 44 is polysilicon and the ILD layer 40 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 3B:
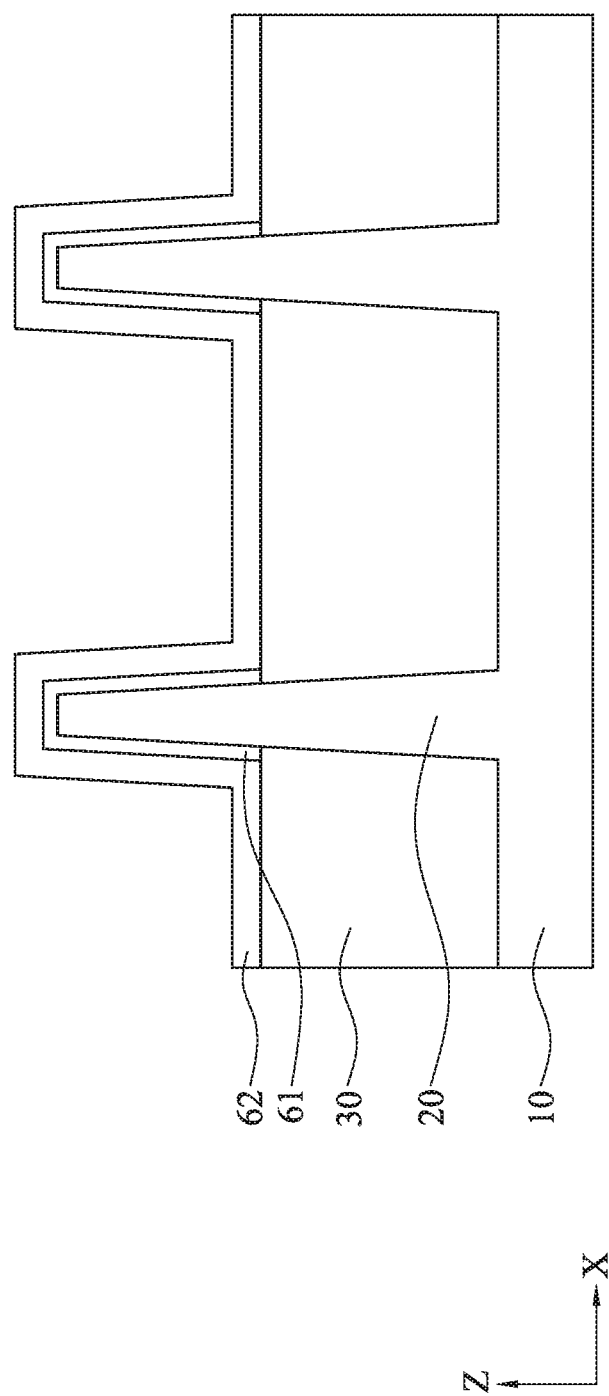

FIG. 3A shows the structure after the channel region of the fin structures 20 are exposed in the gate space 47. In FIGS. 3A-3H, the sidewall spacers 46 and the ILD layer 50 are omitted for simplicity.

As shown in FIG. 3B, at operation 210 of FIG. 1B, an interfacial layer 61 is formed on the fin structure 20 and, at operation 215 of FIG. 1B, a gate dielectric layer 62 is formed on the interfacial layer 61. In some embodiments, the interfacial layer 61 is formed by using chemical oxidation. In some embodiments, the interfacial layer 61 includes one of silicon oxide, silicon nitride and mixed silicon-germanium oxide. The thickness of the interfacial layer 61 is in a range from about 0.2 nm to about 6 nm in some embodiments. In some embodiments, the gate dielectric layer 62 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 62 may be formed by CVD, ALD or any suitable method. In one embodiment, the gate dielectric layer 62 is formed using a highly conformal deposition process such as ALD in order to ensure the formation of a gate dielectric layer having a uniform thickness around each channel layer 20. The thickness of the gate dielectric layer 62 is in a range from about 1 nm to about 100 nm in one embodiment.

Figure 3C:
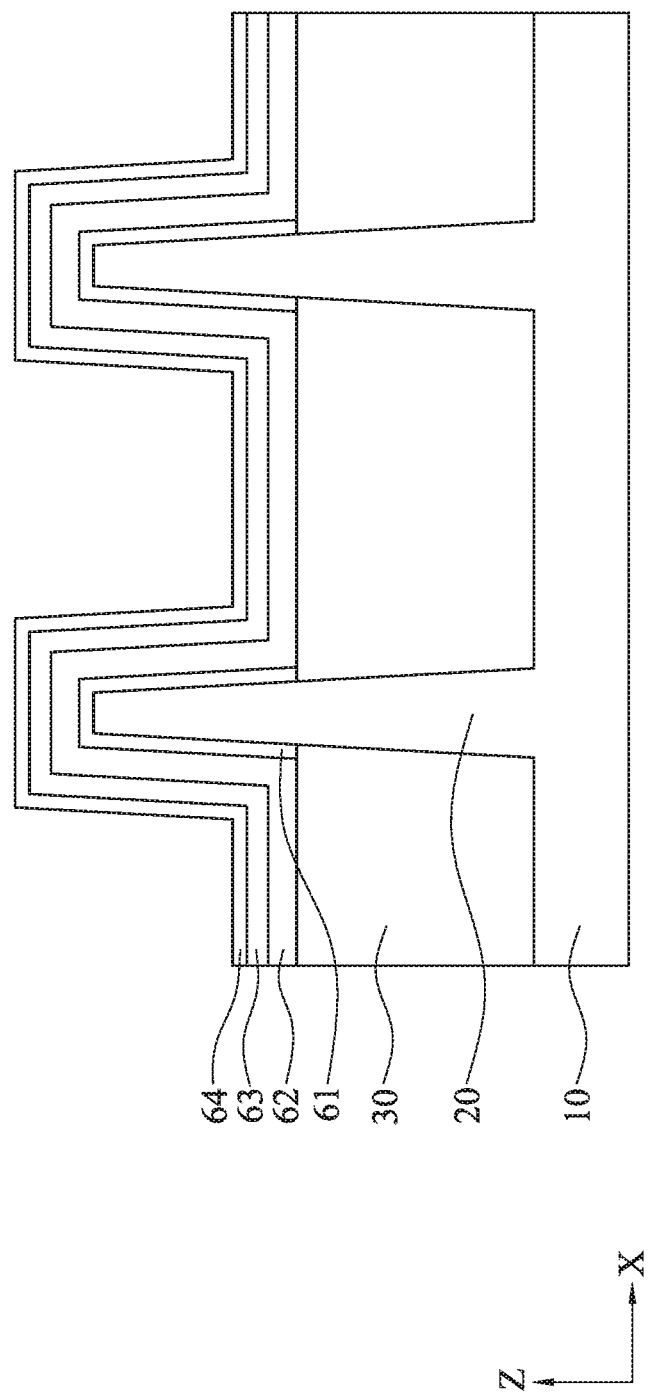

Then, as shown in FIG. 3C, at operation 220 of FIG. 1B, a first conductive layer 63 and a first cap layer 64 are formed. The first conductive layer 63 and the first cap layer 64 are formed by CVD, ALD or any suitable method in some embodiments. In some embodiments, the first cap layer 64 is formed subsequent to the formation of the first conductive layer 63 without breaking the vacuum. In other embodiments, the first cap layer 64 is formed subsequent to the formation of the first conductive layer 63 after breaking the vacuum.

In some embodiments, the first conductive layer 63 is one of Ti, TiN, Ta or TaN. In certain embodiments, the first conductive layer 63 is TiN. In some embodiments, the first cap layer 64 is made of one of Si, SiGe or Ge. The first cap layer 64 is amorphous or polycrystalline in some embodiments.

In some embodiments, at operation 225 of FIG. 1B, after the first cap layer 64 is formed, a first annealing operation is performed for about 1 nsec (spike annealing, such as a laser annealing) to about 360 sec at a temperature of about 550° C. to about 1300° C. In other embodiments, the first annealing is performed at a temperature of about 900° C. to about 1100° C., and in other embodiments, the temperature is from 600° C. to 800° C.

In some embodiments, before the first cap layer 64 is formed, the stacked structure including the interfacial layer 61, the gate dielectric layer 62 and the first conductive layer 63 is soaked in a fluorine containing gas (e.g., $F_2$ and/or $NF_3$) for about 4 sec to about 15 min at a temperature of about room temp (25° C.) to about 550° C. Then, the first cap layer 64 is formed, and a second annealing operation is performed for about 1 nsec (spike annealing, such as a laser annealing) to about 360 sec at a temperature of about 550° C. to about 1300° C. in some embodiments. In some embodiments, the temperature is from 900° C. to 1100° C. This results in the diffusion of the fluorine into the first cap layer 64, the first conductive layer 63 and the gate dielectric layer 62 in some embodiments. In some embodiments, the first conductive layer 63 includes fluorine in an amount of 0.02 atomic % to 75 atomic %. In some embodiments, the gate dielectric layer 62 includes fluorine in an amount of 0.01 atomic % to 40 atomic %. The fluorine soaking operation improves the interface between the high-k gate dielectric layer and the channel region and uniformity of threshold voltages among FETs.

The order of the fluorine soaking and the formation of the Si cap layer 64 is not limited to the above order. In some embodiments, the fluorine soaking is performed prior to the formation of the Si cap layer 64, or the fluorine soaking is simultaneously performed with the formation of the Si cap layer 64. Fluorine soaking may be performed during the Si cap layer deposition by introducing $F_2$ gas at a temperature, for example, in a range from about 300° C. to about 450° C. In some embodiments, the fluorine soaking is performed after the formation of Si cap layer 64. In other embodiments, the fluorine soaking operation is not performed at this stage.

After the second annealing operation, the first cap layer 64 is removed, at operation 230 of FIG. 1B.

Figure 3D:
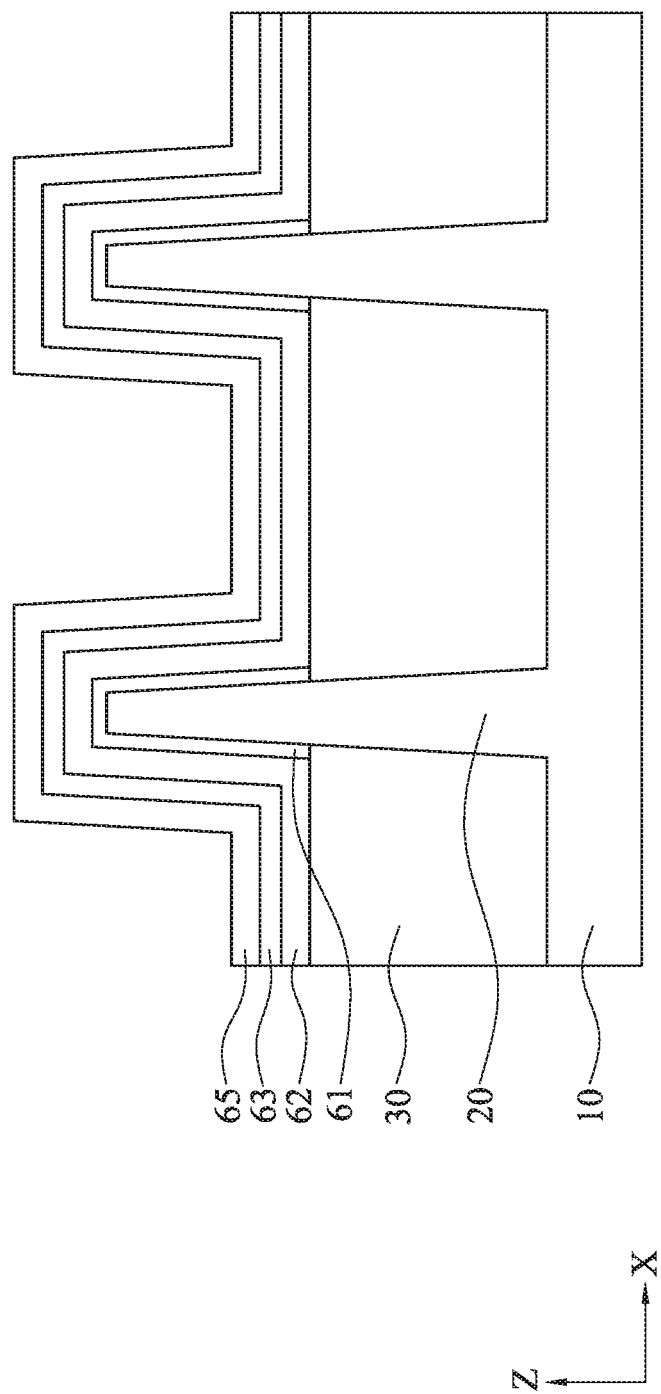

Subsequently, as shown in FIG. 3D, at operation 235 of FIG. 1B, the second conductive layer 65 is formed over the first conductive layer 63. In some embodiments, the second conductive layer 65 is made of TaN and serves as an etch stop barrier layer. The second conductive layer 65 may be formed by ALD, PVD, CVD, e-beam evaporation, or other suitable process. In some embodiments, the thickness of the second conductive layer 65 is in a range from about 1.0 nm to about 10.0 nm, and in other embodiments, the thickness is in a range from about 2.0 nm to about 5.0 nm.

Then, as shown in FIG. 3E, at operation 240 of FIG. 1B, a protective layer 66 is formed on a surface of the second conductive layer 65. In this embodiment, the protective layer 66 is a modified surface region of the second conductive layer 65. The modified layer is resistive to a subsequent wet operation using $H_3PO_4$.

In some embodiments, the protective layer 66 is a doped layer of the first conductive layer 63. The dopant includes one or more of boron, silicon, carbon and nitrogen. The dopants are introduced into the surface portion of the first conductive layer 63 by applying gas containing the dopants or implanting ions of the dopants into the surface portion. In some embodiments, the protective layer 66 is a boron containing layer of a TaN layer 63 formed by applying $B_2H_6$ gas to the surface of the TaN layer 63. In some embodiments, the surface of the TaN layer is treated with $B_2H_6$ gas at a temperature in a range from about 250° C. to about 400° C. In some embodiments, the $B_2H_6$ gas is applied to the surface of the TaN 65 for 1 sec to 60 sec. Within the ranges of the boron treatment conditions, it is possible obtain a sufficient volume of the boron containing layer. In some embodiments, boron concentration of the boron containing layer 66 is in a range from about 3 atomic % to 10 atomic %, and is in a range from about 4 atomic % to about 6 atomic % in other embodiments. The thickness of the boron containing layer 66 is in a range from about 0.1 nm to about 1.0 nm in some embodiments, and is in a range from about 0.2 nm to about 0.5 nm in other embodiments. In other embodiments, an ion implantation operation using $BF_2$ is employed to form the boron containing layer 66.

Figure 3F:
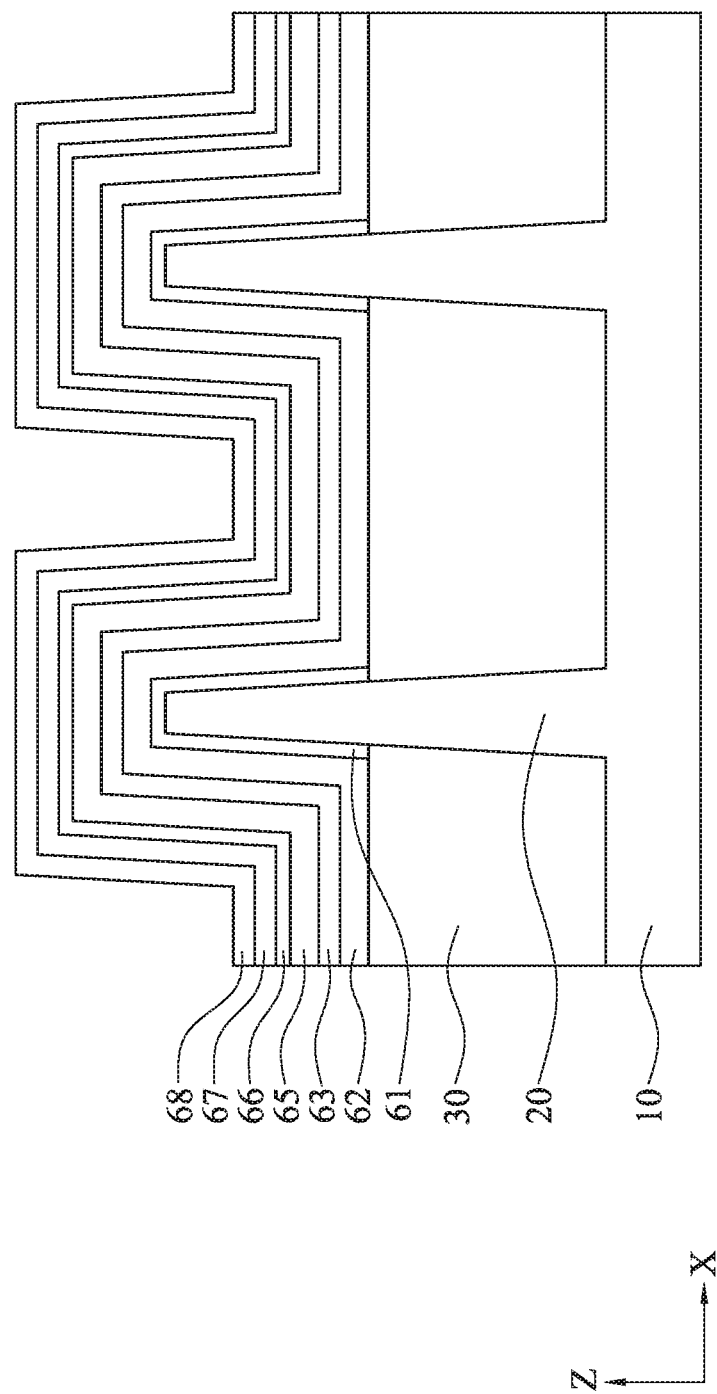

Then, as shown in FIG. 3F, at operation 245 of FIG. 1B, a third conductive layer 67 is formed over the protective layer 66 and a fourth conductive layer 68 is formed over the third conductive layer 67. In some embodiments, the third and/or fourth conductive layers are metallic layers. In some embodiments, the third conductive layer 67 is a W (tungsten) layer, and the fourth conductive layer 68 is a TiN layer.

The W layer 67 functions as a nucleation layer for the TiN layer 68 in some embodiments. In some embodiments, the W layer 67 is formed by ALD using $WF_6$ as a precursor gas at a temperature in a range from about 200° C. to about 400° C. In some embodiments, the $WF_6$ precursor gas is applied five to ten times. A purge gas is supplied between supplying the precursor gas. The purge gas includes one or more of Ar, He and $N_2$ in some embodiments. This creates the W layer 67 having a thickness in a range from about 0.1 nm to about 2 nm in some embodiments. In some embodiments, the W layer 67 includes fluorine. In some embodiments, the W layer 67 includes discontinuous islands of tungsten (grains). Then, a TiN layer 68 is formed over the W layer 67 at a temperature in a range from about 350° C. to about 550° C. The thickness of the TiN layer 68 is in a range from about 0.5 nm to about 10 nm in some embodiments, and is in a range from about 1 nm to about 5 nm in other embodiments.

Subsequently, at operation 250 of FIG. 1B, a third annealing operation is performed for about 1 nsec (spike annealing, such as a laser annealing) to about 360 sec at a temperature of about 450° C. to about 650° C. in some embodiments. In some embodiments, the TiN layer 68 and/or the W layer 67 function as a cap layer for the annealing. In some embodiments, this results in the diffusion of the fluorine from the $WF_6$ gas for the W layer into the first conductive layer 63 and the gate dielectric layer 62. In some embodiments, the fluorine also diffuses into the TiN layer 68.

Figure 3G:
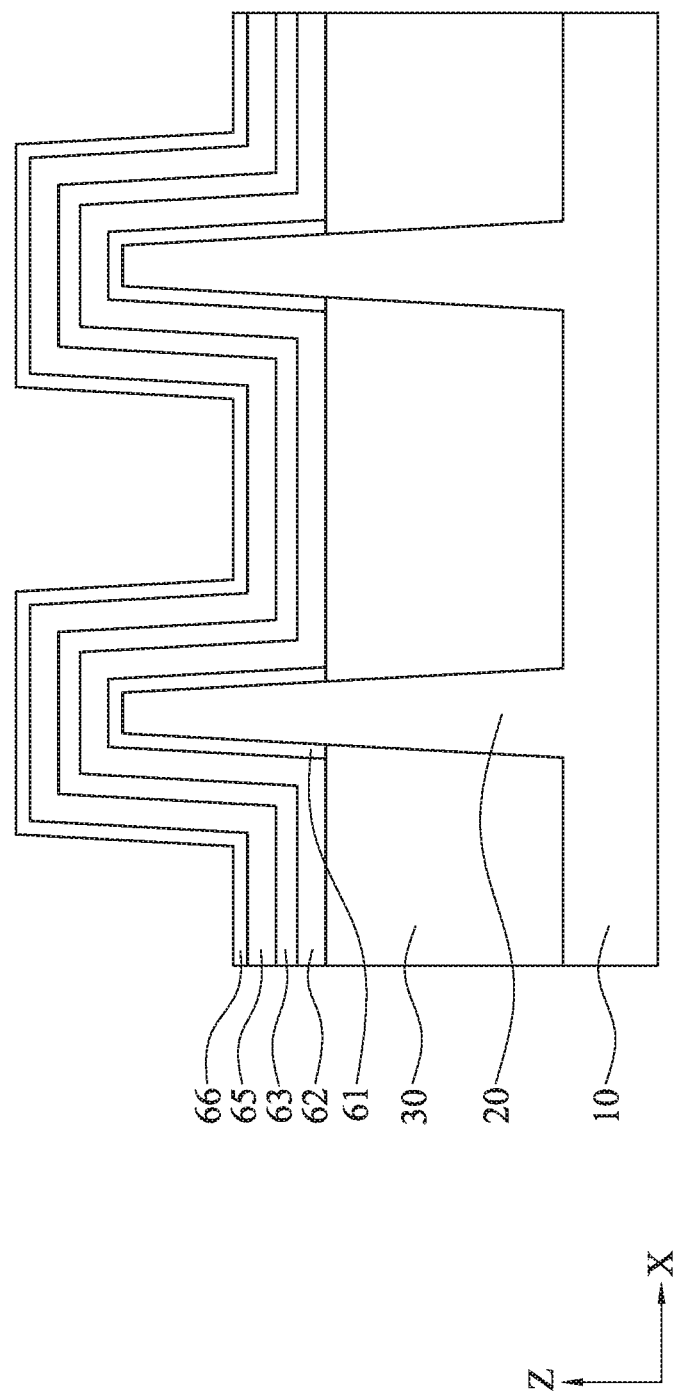

Then, as shown in FIG. 3G, at operation 255 of FIG. 1B, the TiN layer 68 and the W layer 67 are removed. In some embodiments, the TiN layer 68 and the W layer 67 are removed by an aqueous solution containing $H_3PO_4$, $H_2O_2$ and $H_2O$. Due to the protective layer 66, a chemical reaction and/or physical interaction between the TaN layer 65 and the W layer is suppressed, and the aqueous solution does not cause damage to the TaN layer 65. In some embodiments, the etching rate of the TiN layer 68 and/or the W layer 67 by the aqueous solution is about 100 to 10000 times the etching rated of the TaN layer 65. The amount of loss in the thickness of the TaN layer 65 is less than 10% of the initial thickness in some embodiments. In some embodiments, the loss is about 1% or more of the initial thickness in some embodiments. The amount of loss in the thickness of the TaN layer 65 is less than 0.5 nm in some embodiments. In some embodiments, the loss is about 0.1 nm or more. In some embodiments, after the TiN layer 68 and the W layer 67 are removed, the surface of the TaN layer 65 is subjected to wet cleaning.

If the protective layer 66 is not formed on or in the surface of the TaN layer 65, tungsten from $WF_6$ gas may diffuse into the TaN layer 65 and create $WN_x$ layer or regions. In such a case, the $WN_x$ layer or regions are removed by the aqueous solution containing $H_3PO_4$, causing a loss of thickness in the TaN layer 65. By using the protective layer 66, it is possible to prevent or suppress the loss of thickness of the TaN layer 65.

After the TiN layer 67 and W layer 68 are moved, one or more work function adjustment layers 82 and a body gate metal layer 84 are formed over the TaN layer 65 (or the boron containing protective layer 66) as shown in FIG. 3H, at operation 260 of FIG. 1B.

In some embodiments, the work function adjustment layer 82 is made of a conductive material such as a single layer of TiN, WN, TaAlC, TiC, TaC, Co, Al, TiAl, or TiAlC, or a multilayer of two or more of these materials. For an n-channel FET, one or more of TaN, TaAlC, TiN, TiC, Co, or TiAl is used as the work function adjustment layer, and for a p-channel FET, one or more of TiAlC, Al, TiAl, TaN, TaAlC, TiN, WN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers. In some embodiments, the work function adjustment layer 82 is deposited and selectively removed from some transistors by using one or more lithography and etching operations.

The body metal layer 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body metal layer 84 may be formed by CVD, ALD, electro-plating, or other suitable method.

After forming the gate electrode, further CMOS processes are performed to form various features such as one or more interlayer dielectric layers, contacts/vias, interconnect metal layers, and passivation layers, etc.

FIGS. 4A-4D show cross sectional views of manufacturing a semiconductor device according to another embodiment of the present disclosure. It is understood that in the sequential manufacturing process, one or more additional operations can be provided before, during, and after the stages shown in FIGS. 4A-4D, and some of the operations described below are replaced or eliminated for additional embodiments of the method. The order of the operations/processes may be interchangeable. Materials, configurations, dimensions, processes and/or operations as described with respect to the foregoing embodiments may be employed in the following embodiment, and detailed description thereof may be omitted.

In this embodiment, the protective layer is an additional layer formed on the surface of the second conductive layer 65.

Figure 4A:
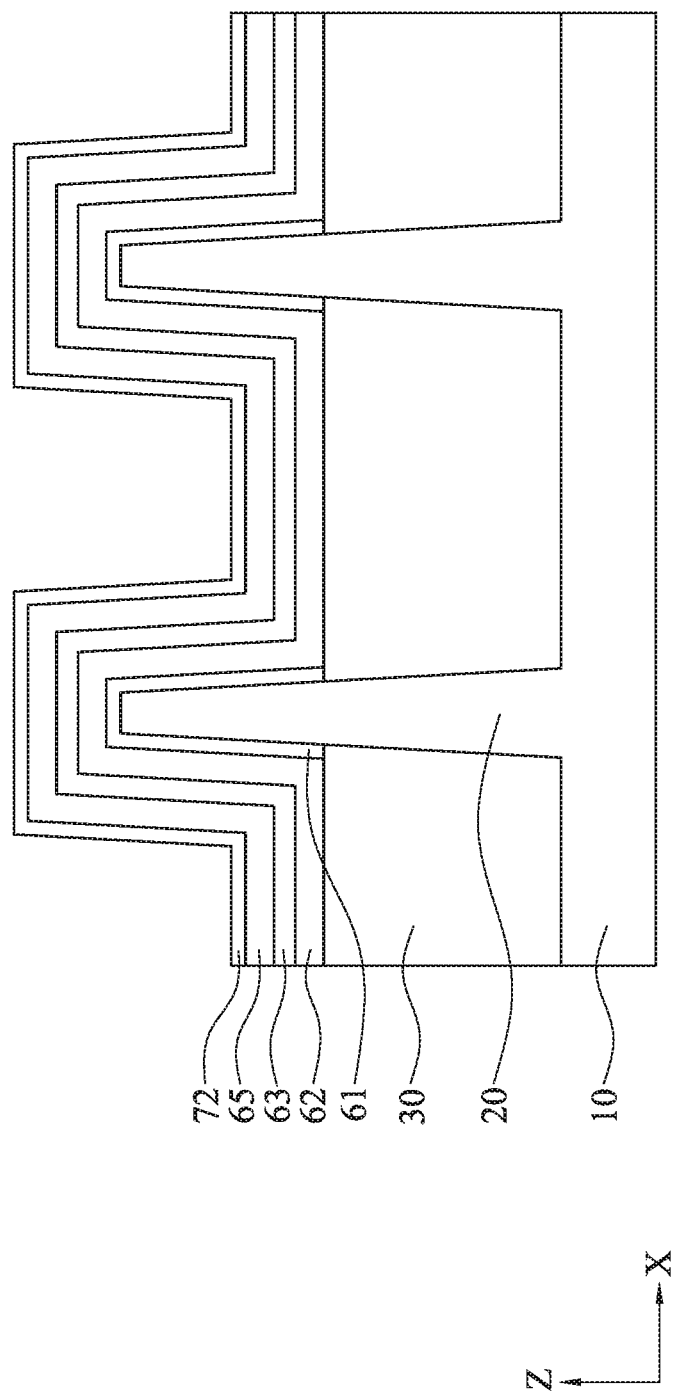
FIGS. 4A, 4B, 4C and 4D show cross sectional views of various stages of a sequential manufacturing process of a semiconductor device according to an embodiment of the present disclosure.

After the second conductive layer 65 (e.g., a TaN layer) is formed as shown in FIG. 3D, a protective layer 72 is formed on the upper surface of the second conductive layer 65, as shown in FIG. 4A. In some embodiments, the protective layer 72 includes a conductive material, such as Ta doped with B, Si, N and C, Ti doped with B, Si, C and/or N, silicide or any other suitable material. In certain embodiments, Ta containing B and N is used as the protective layer 72. The protective layer 72 may be formed by CVD, ALD, electro-plating, or other suitable method. In some embodiments, the thickness of the protective layer is in a range from about 1 nm to about 10 nm, and is in a range from about 2 nm to about 5 nm in other embodiments.

Figure 4B:
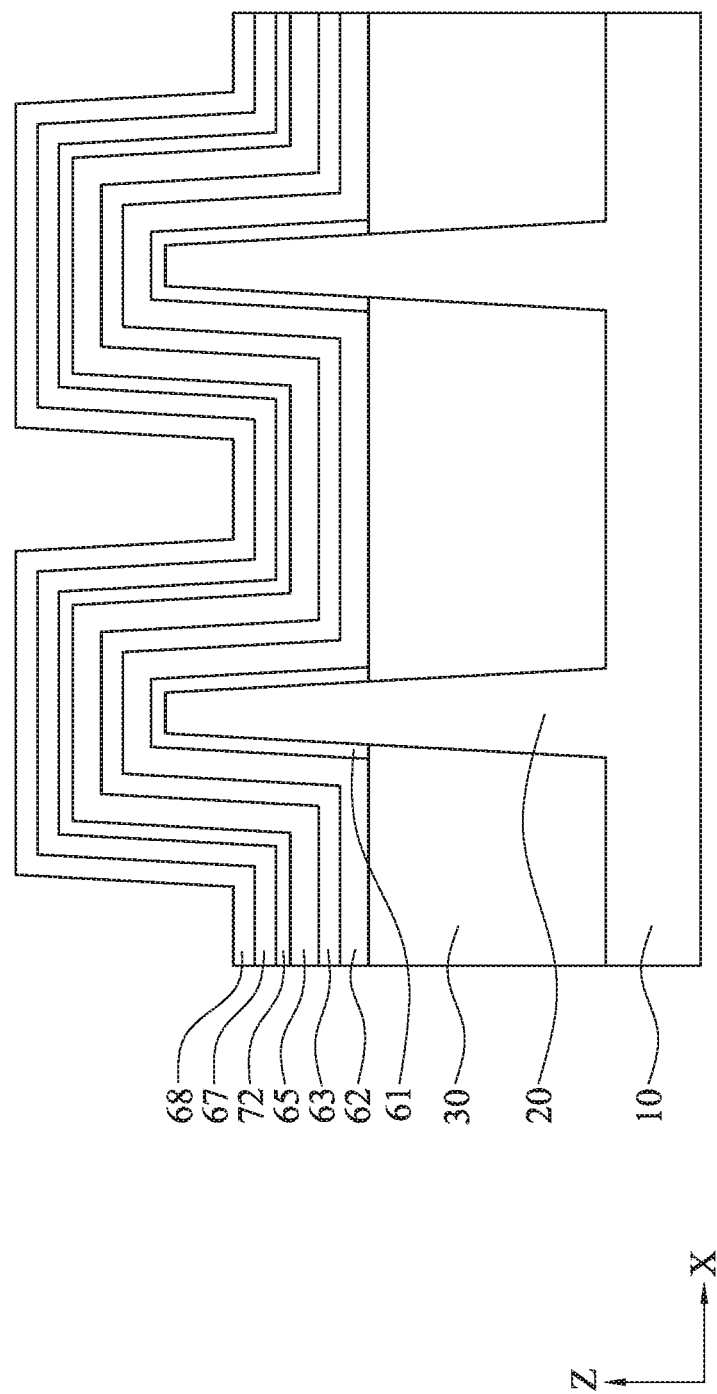

Then, similar to the operations explained with respect to FIG. 3F, a third conductive layer 67 is formed over the protective layer 72 and a fourth conductive layer 68 is formed over the third conductive layer 67, as shown in FIG. 4B. In some embodiments, the third conductive layer 67 is a tungsten (W) layer, and the fourth conductive layer 68 is a TiN layer. Subsequently, a third annealing operation is performed for about 1 nsec (spike annealing, such as a laser annealing) to about 360 sec at a temperature of about 450° C. to about 650° C. in some embodiments.

Figure 4C:
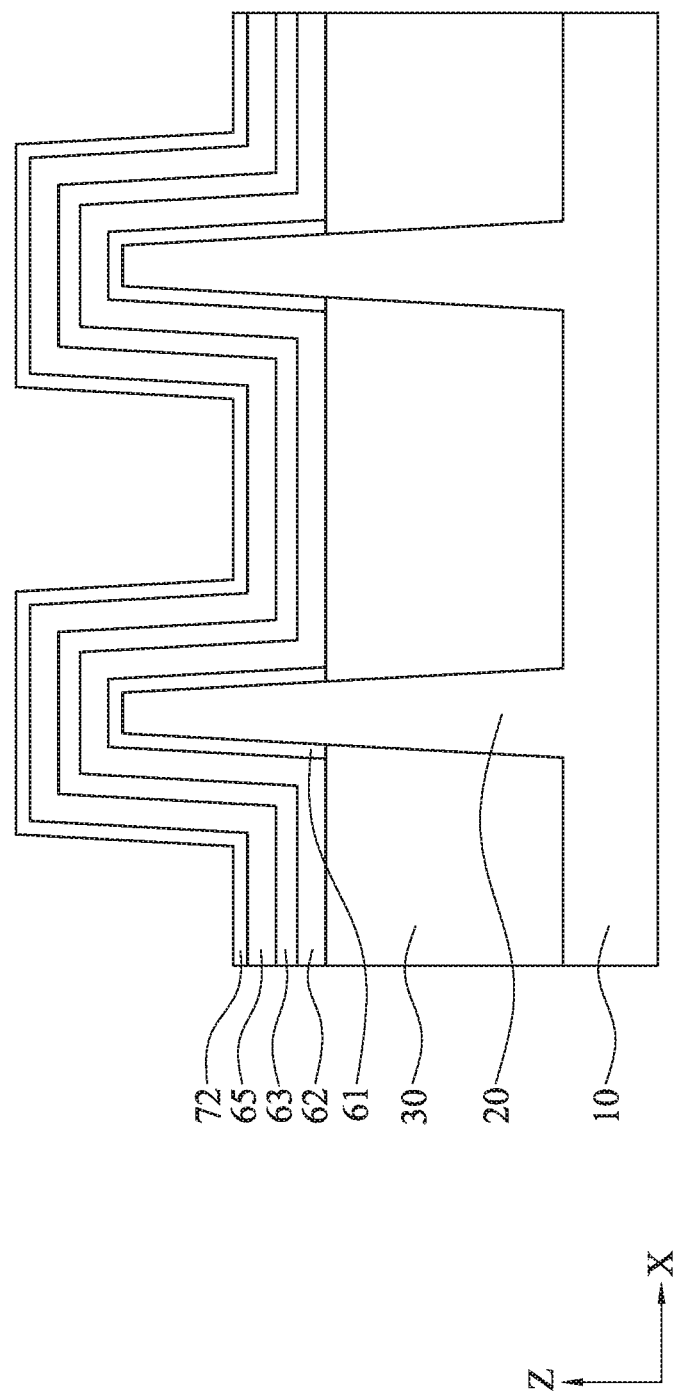

Next, similar to the operations explained with respect to FIG. 3G, the TiN layer 68 and the W layer 67 are removed, as shown in FIG. 4C. In some embodiments, the TiN layer 68 and the W layer 67 are removed using an aqueous solution containing $H_3PO_4$, $H_2O_2$ and $H_2O$. Due to the protective layer 72, a chemical reaction and/or physical interaction between the TaN layer 65 and the W layer is suppressed. The aqueous solution does not cause damage to the TaN layer 65. The amount of loss in the thickness of the TaN layer 65 is less than 10% of the initial thickness in some embodiments. The amount of loss in the thickness of the TaN layer 65 is less than 0.5 nm in some embodiments.

Figure 4D:
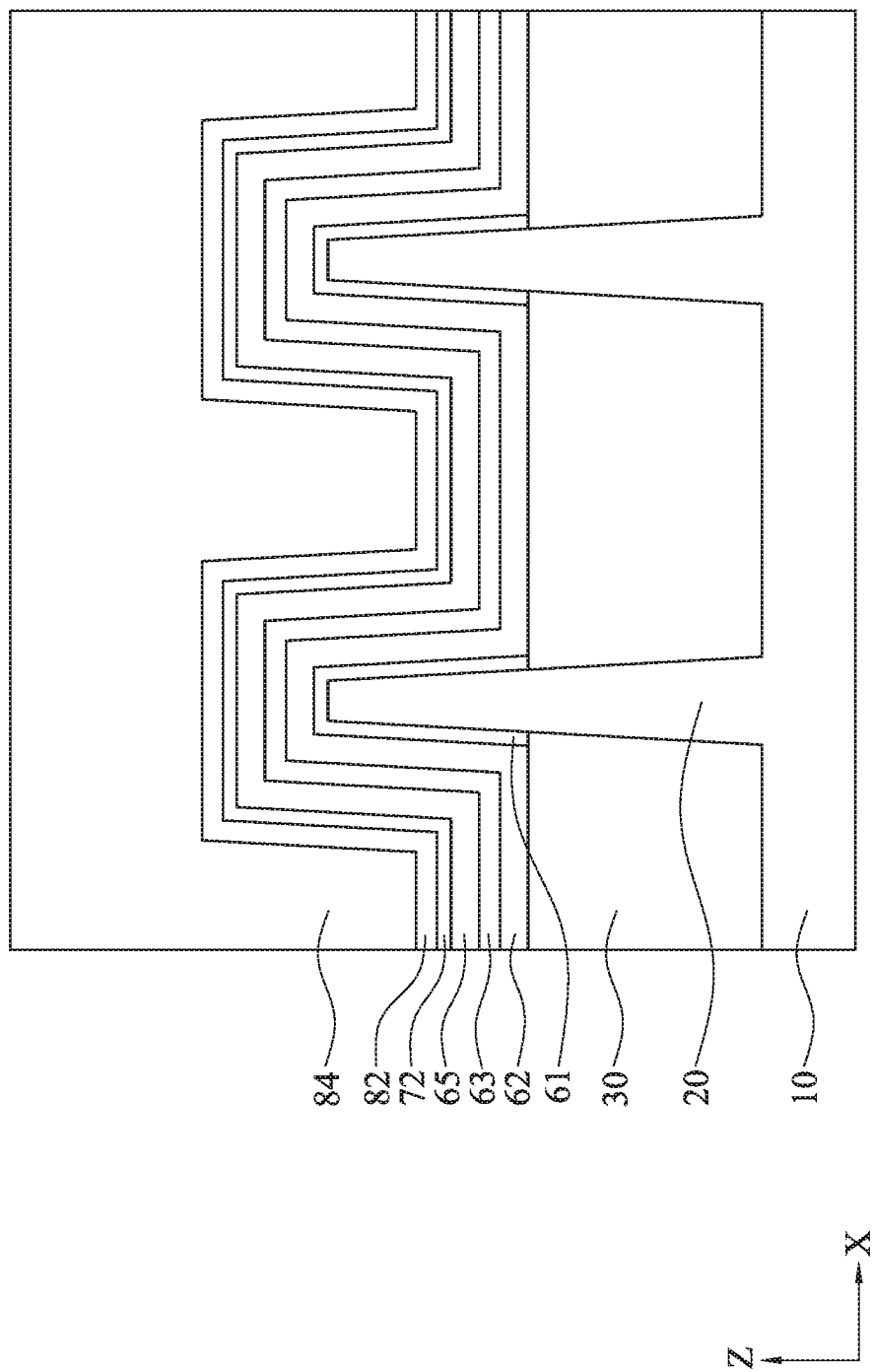

After the TiN layer 67 and W layer 68 are moved, similar to the operations explained with respect to FIG. 3H, one or more work function adjustment layers 82 and a body gate metal layer 84 are formed over the protective layer 72, as shown in FIG. 4D.

FIGS. 5A-5D show cross sectional views of manufacturing a semiconductor device according to another embodiment of the present disclosure. It is understood that in the sequential manufacturing process, one or more additional operations can be provided before, during, and after the stages shown in FIGS. 5A-5D, and some of the operations described below can be replaced or eliminated for additional embodiments of the method. The order of the operations/processes may be interchangeable. Materials, configurations, dimensions, processes and/or operations as described with respect to the foregoing embodiments may be employed in the following embodiment, and detailed description thereof may be omitted.

In this embodiment, the protective layer is removed before the work function adjustment layer is formed.

After the second conductive layer 65 (e.g., a TaN layer) is formed as shown in FIG. 3D, a protective layer 74 is formed on the upper surface of the second conductive layer 65. In some embodiments, the protective layer 74 includes a conductive material, such as Ta doped with B, Si, N and C, Ti doped with B, Si, C and/or N, silicide or any other suitable material. In certain embodiments, Ta containing B and N is used as the protective layer 74. In other embodiments, the protective layer 74 includes an insulating material, such as silicon oxide, silicon nitride, SiON and SiCN, polymer or any other suitable insulating material. In other embodiments, the protective layer 74 includes a semiconductor material, such as silicon, SiGe and Ge or any other suitable semiconductor material. The protective layer 74 may be formed by CVD, ALD, electro-plating, or other suitable method. In some embodiments, the thickness of the protective layer 74 is in a range from about 1 nm to about 10 nm, and is in a range from about 2 nm to about 5 nm in other embodiments.

Figure 5A:
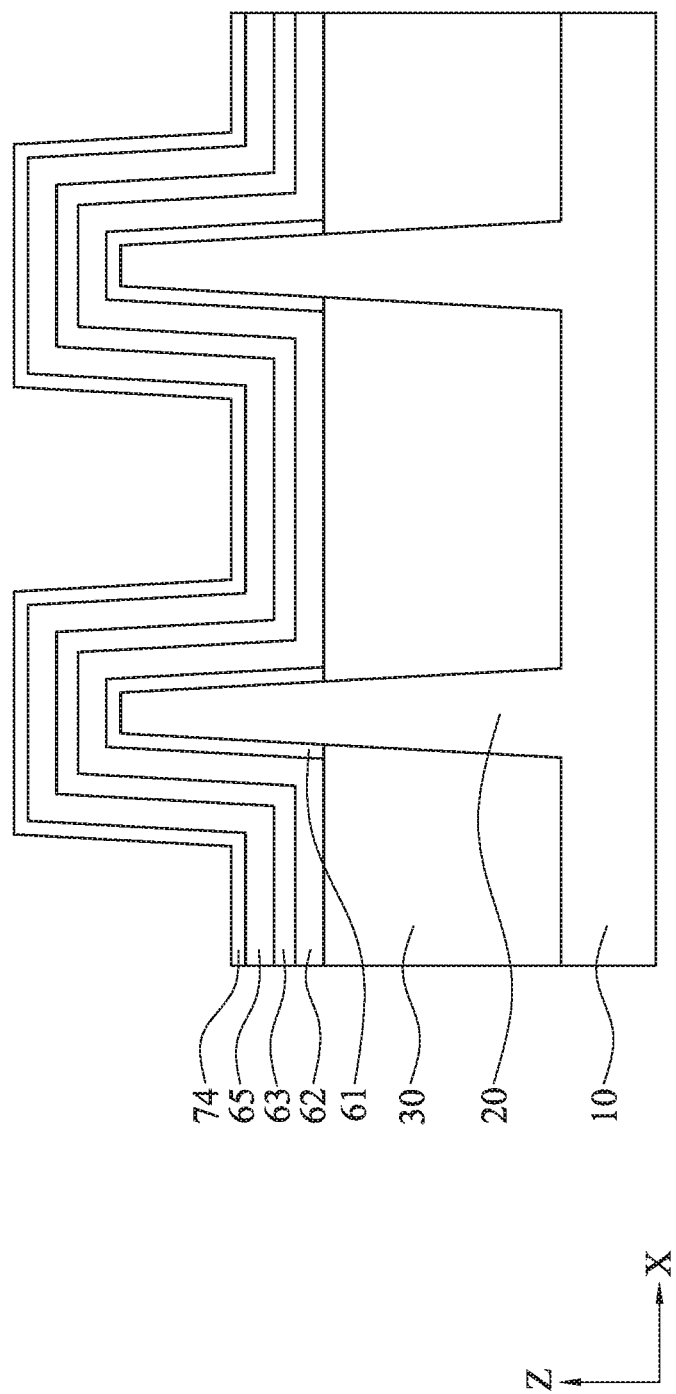
FIGS. 5A, 5B, 5C and 5D show cross sectional views of various stages of a sequential manufacturing process of a semiconductor device according to an embodiment of the present disclosure.
Figure 5B:
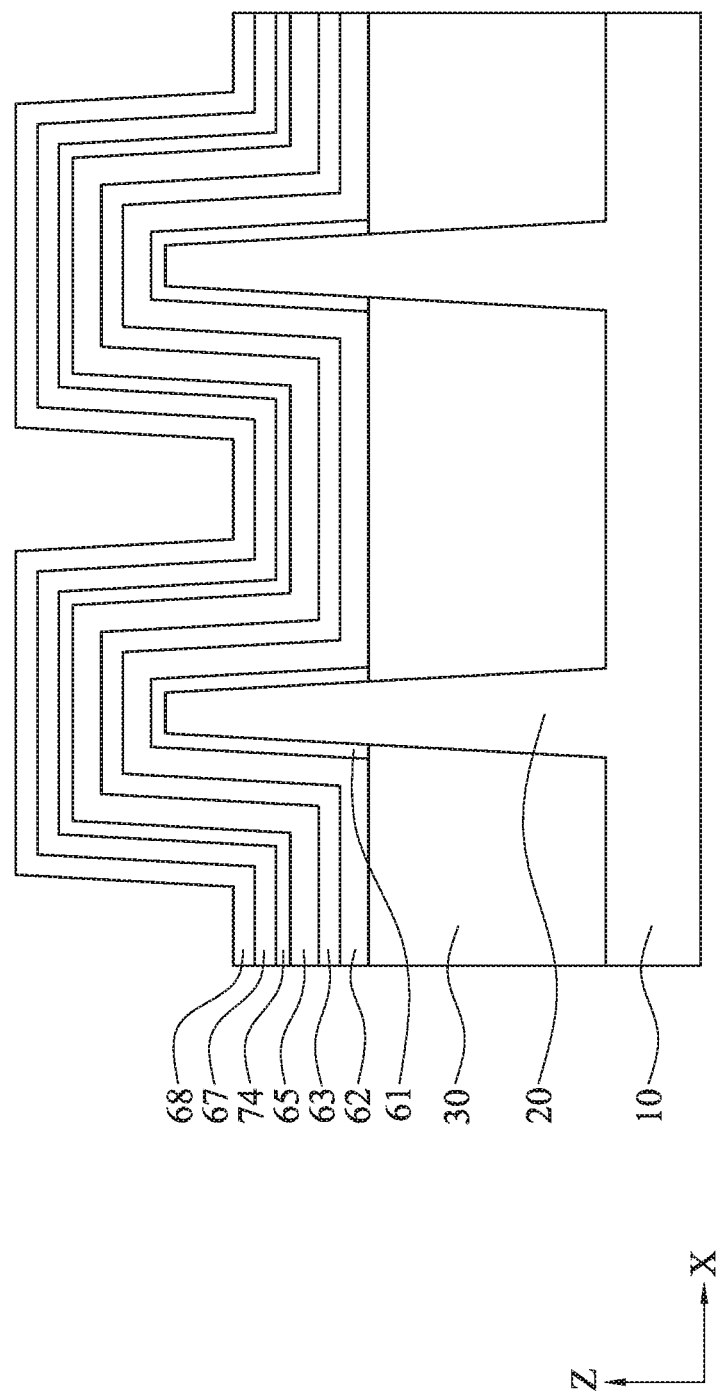

Then, similar to the operations explained with respect to FIGS. 3F and 4B, a third conductive layer 67 is formed over the protective layer 74 and a fourth conductive layer 68 is formed over the third conductive layer 67, as shown in FIG. 5B. In some embodiments, the third conductive layer 67 is a tungsten (W) layer, and the fourth conductive layer 68 is a TiN layer. Subsequently, a third annealing operation is performed for about 1 nsec (spike annealing, such as a laser annealing) to about 360 sec at a temperature of about 450° C. to about 650° C. in some embodiments.

Figure 5C:
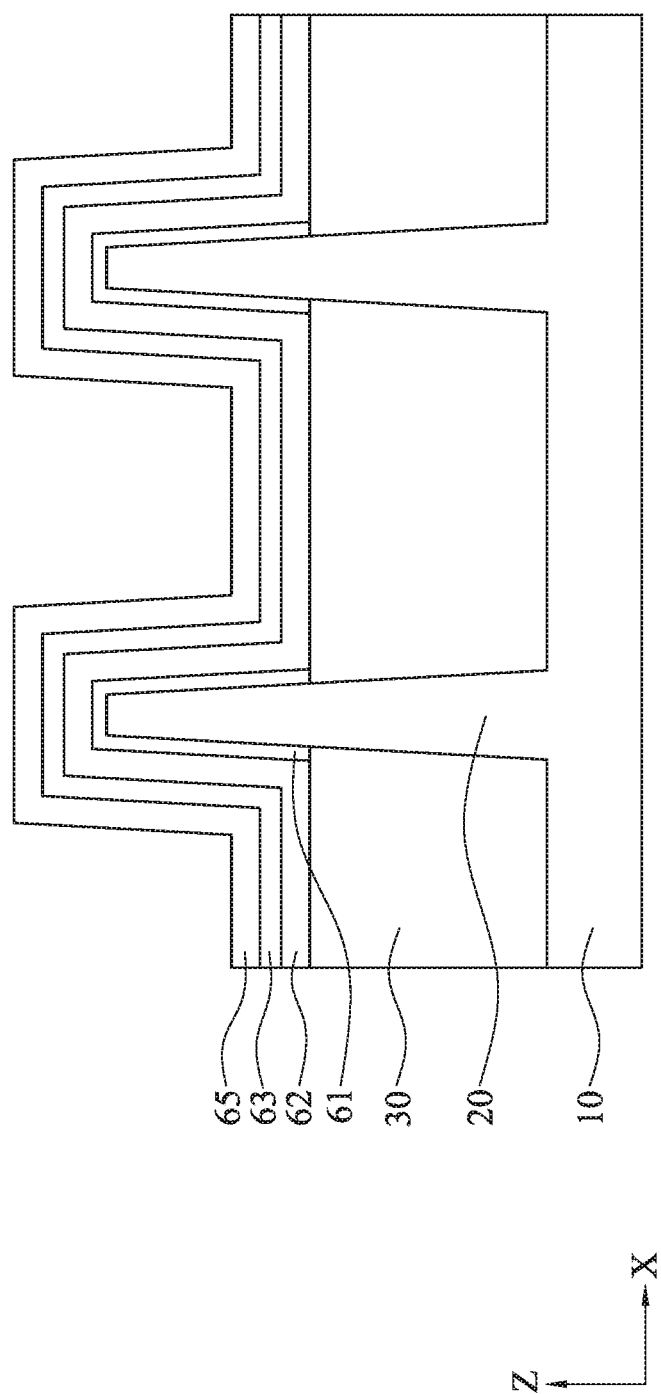

Next, similar to the operations explained with respect to FIGS. 3G and 4C, the TiN layer 68 and the W layer 67 are removed. In some embodiments, the TiN layer 68 and the W layer 67 are removed by an aqueous solution containing $H_3PO_4$, $H_2O_2$ and $H_2O$. Due to the protective layer 74, a chemical reaction and/or physical interaction between the TaN layer 65 and the W layer is suppressed, and the aqueous solution does not cause damage to the TaN layer 65. The amount of loss in the thickness of the TaN layer 65 is less than 10% of the initial thickness in some embodiments. The amount of loss in the thickness of the TaN layer 65 is less than 0.5 nm in some embodiments. Further, the protective layer 74 is removed, as shown in FIG. 5C.

Figure 5D:
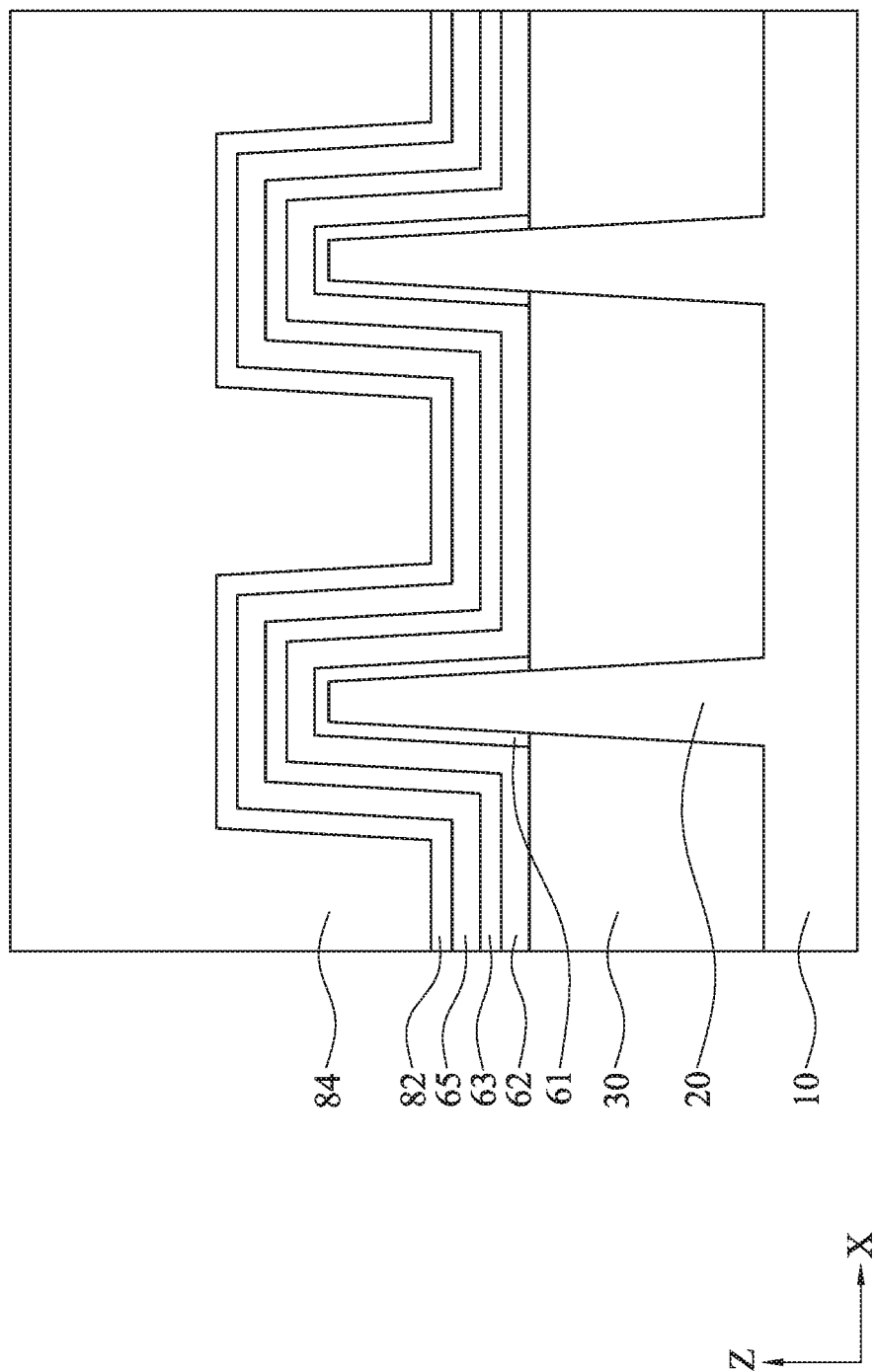

After the protective layer 74 is removed, similar to the operations explained with respect to FIGS. 3H and 4D, one or more work function adjustment layers 82 and a body gate metal layer 84 are formed over the second conductive layer 65 (e.g., TaN layer), as shown in FIG. 5D.

The various embodiments or examples described herein offer several advantages over the existing art. In the present embodiments, a protective layer is formed on or in the surface of a TaN layer of a metal gate structure of an FET. The protective layer prevents or suppresses loss of thickness in the TaN layer otherwise caused by a subsequent wet operation using an aqueous solution containing $H_3PO_4$.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate dielectric layer is formed over a channel region, a first conductive layer is formed over the gate dielectric layer, a protective layer is formed at a surface region of the first conductive layer, a metallic layer is formed by applying a metal containing gas on the protective layer, and the metallic layer is removed by a wet etching operation using a solution. The protective layer is resistant to the solution of the wet etching operation. In one or more of the foregoing and following embodiments, the first conductive layer is TaN. In one or more of the foregoing and following embodiments, the protective layer is formed by introducing boron into the surface region of the first conductive layer. In one or more of the foregoing and following embodiments, the protective layer is formed by applying a boron containing gas to a surface of the first conductive layer. In one or more of the foregoing and following embodiments, the boron containing gas is $B_2H_6$. In one or more of the foregoing and following embodiments, the protective layer is formed by implanting boron into the surface region of the first conductive layer. In one or more of the foregoing and following embodiments, the metallic layer includes a W layer. In one or more of the foregoing and following embodiments, the W layer is formed by a gas containing $WF_6$. In one or more of the foregoing and following embodiments, the solution includes $H_3PO_4$. In one or more of the foregoing and following embodiments, a loss of a thickness of the TaN layer after the wet etching operation is less than 0.5 nm compared with a thickness of the TaN layer as formed.

In accordance with another aspect of the present disclosure, in a method of manufacturing a semiconductor device, a gate dielectric layer is formed over a channel region, a first conductive layer is formed over the gate dielectric layer, a second conductive layer is formed over the first conductive layer, a protective layer is formed on a surface or at a surface region of the first conductive layer, a metallic layer is formed by using a metal containing gas over the protective layer, and the metallic layer is removed by a wet etching operation using a solution containing $H_3PO_4$. The protective layer is resistant to the solution of the wet etching operation. In one or more of the foregoing and following embodiments, the first conductive layer is TiN and the second conductive layer is TaN. In one or more of the foregoing and following embodiments, the protective layer is formed by applying a gas containing one element selected from the group consisting of B, N, C, and Si to a surface of the second conductive layer. In one or more of the foregoing and following embodiments, the protective layer is formed by CVD or ALD. In one or more of the foregoing and following embodiments, the metallic layer includes a W layer formed by using a gas containing $WF_6$. In one or more of the foregoing and following embodiments, after the metallic layer is formed, an annealing operation is performed at a temperature from 450° C. to 650° C. In one or more of the foregoing and following embodiments, after forming the first conductive layer and before forming the second conductive layer, a first cap layer is formed over the first conductive layer, an annealing operation is performed after the first cap layer is formed, and the first cap layer is removed after the annealing operation. In one or more of the foregoing and following embodiments, the first cap layer is made of crystalline, polycrystalline or amorphous silicon. In one or more of the foregoing and following embodiments, the forming a metallic layer includes applying the metal containing gas over the protective layer to form a nucleation layer, and forming a TiN layer over the nucleation layer, and after the TiN layer is formed, a second annealing operation is performed.

In accordance with another aspect of the present disclosure, in a method of manufacturing a semiconductor device, a first conductive layer is formed over an underlying layer, a boron containing layer is formed by introducing boron into the first conductive layer, a gas containing one or more element that is capable of intermixing with the first conductive layer is applied, and a second conductive layer is formed over the boron containing layer. An intermixed layer is capable of being resolved in an aqueous solution containing $H_3PO_4$.

In accordance with one aspect of the present disclosure, a semiconductor device includes a channel layer, a gate dielectric layer disposed over the channel layer, a first conductive layer disposed over the gate dielectric layer, a protective layer disposed over the first conductive layer, and a second conductive layer disposed over the protective layer. The protective layer includes one selected from the group consisting of a boron containing layer, a silicon containing layer, a carbon containing layer and a nitrogen containing layer. In one or more of the foregoing and following embodiments, a thickness of the protective layer is in a range from 0.1 nm to 1.0 nm. In one or more of the foregoing and following embodiments, the first conductive layer is a TaN layer. In one or more of the foregoing and following embodiments, the cap layer is a boron containing layer. In one or more of the foregoing and following embodiments, the boron containing layer includes boron in an amount of 4 atomic % to 10 atomic %. In one or more of the foregoing and following embodiments, the second conductive layer includes one or more work function adjustment layers and a body metal layer. In one or more of the foregoing and following embodiments, the body metal layer is made of W. In one or more of the foregoing and following embodiments, the first conductive layer includes fluorine in an amount of 0.02 atomic % to 75 atomic %. In one or more of the foregoing and following embodiments, the gate dielectric layer includes fluorine in an amount of 0.01 atomic % to 40 atomic %.

In accordance with another aspect of the present disclosure, a semiconductor device includes a channel layer, a gate dielectric layer disposed over the channel layer, a first conductive layer disposed over the gate dielectric layer, a second conductive layer disposed over the first conductive layer, and a third conductive layer disposed over the second conductive layer. An upper surface region of the second conductive layer includes boron. In one or more of the foregoing and following embodiments, the upper surface region includes boron in an amount of 4 atomic % to 10 atomic %. In one or more of the foregoing and following embodiments, a thickness of the upper surface region which includes boron is in a range from 0.1 nm to 0.5 nm. In one or more of the foregoing and following embodiments, the second conductive layer is TaN. In one or more of the foregoing and following embodiments, the first conductive layer is TiN. In one or more of the foregoing and following embodiments, the third conductive layer is one or more layers of Ti, TiN, WN, TaAlC, TiC, TaC, TiAl and TiAlC. In one or more of the foregoing and following embodiments, the semiconductor device further includes a fourth conductive layer disposed over the third conductive layer. In one or more of the foregoing and following embodiments, a thickness of the second conductive layer is in a range from 1.0 nm to 5.0 nm.

In accordance with another aspect of the present disclosure, a semiconductor device includes a fin structure including a channel region, a gate dielectric layer disposed over the channel region, a TiN layer disposed over the gate dielectric layer, a TaN layer disposed over the TiN layer, a protective layer disposed over the TaN layer, a work function adjustment layer disposed over the protective layer, and a meta gate layer disposed over the work function adjustment layer. The protective layer is resistive to a solution containing $H_3PO_4$. In one or more of the foregoing and following embodiments, the protective layer contains one or more of C, Si, and B. In one or more of the foregoing and following embodiments, the protective layer is made of Ta containing N and B. In one or more of the foregoing and following embodiments, the thickness of the protective layer is in a range from 1 nm to 10 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device including a field effect transistor, comprising:
   forming a gate dielectric layer over a channel region;
   forming a first conductive layer over the gate dielectric layer;
   forming a protective layer at a surface region of the first conductive layer;
   forming a metallic layer by applying a metal containing gas on the protective layer;
   removing the metallic layer by a wet etching operation using a solution,
   wherein the protective layer protects the first conductive layer from the solution of the wet etching operation so that the protective layer remains at an end of the wet etching operation.

2. The method of claim 1, wherein the first conductive layer is TaN and the protective layer is TaN containing boron.

3. The method of claim 2, wherein the protective layer is formed by introducing boron into the surface region of the first conductive layer.

4. The method of claim 3, wherein the protective layer is formed by applying a boron containing gas to a surface of the first conductive layer.

5. The method of claim 4, wherein the boron containing gas is $B_2H_6$.

6. The method of claim 3, wherein the protective layer is formed by implanting boron into the surface region of the first conductive layer.

7. The method of claim 2, wherein the metallic layer includes a W layer formed by a gas containing $WF_6$.

8. The method of claim 2, wherein the solution includes $H_3PO_4$.

9. The method of claim 2, wherein a loss of a thickness of the TaN layer after the wet etching operation is less than 0.5 nm compared with a thickness of the TaN layer as formed.

10. The method of claim 1, wherein the protective layer includes Ta doped with one of B, Si, N or C, Ti doped with one of B, Si, C or N, silicide, polymer or dielectric.

11. A method of manufacturing a semiconductor device including a field effect transistor, comprising:
    forming a gate dielectric layer over a channel region;
    forming a first conductive layer over the gate dielectric layer;
    forming a second conductive layer over the first conductive layer;
    forming a protective layer on a surface or at a surface region of the second conductive layer;
    forming a metallic layer by using a metal containing gas over the protective layer; and
    removing the metallic layer by a wet etching operation using a solution containing $H_3PO_4$,
    wherein the protective layer protects the second conductive layer from the solution of the wet etching operation so that the protective layer remains at an end of the wet etching operation.

12. The method of claim 11, wherein the first conductive layer is TiN, the second conductive layer is TaN and the protective layer is TaN containing boron.

13. The method of claim 11, wherein the protective layer is formed by applying a gas containing one element selected from the group consisting of B, N, C, and Si to a surface of the second conductive layer.

14. The method of claim 11, wherein the protective layer is formed by CVD or ALD.

15. The method of claim 11, wherein the metallic layer includes a W layer formed by using a gas containing $WF_6$.

16. The method of claim 11, further comprising, after the metallic layer is formed, performing an annealing operation at a temperature from 450° C. to 650° C.

17. The method of claim 11, further comprising, after forming the first conductive layer and before forming the second conductive layer:
    forming a first cap layer over the first conductive layer;
    performing an annealing operation after the first cap layer is formed; and
    removing the first cap layer after the annealing operation.

18. The method of claim 17, wherein the first cap layer is made of crystalline, polycrystalline or amorphous silicon.

19. The method of claim 11, wherein:
    the forming a metallic layer includes applying the metal containing gas over the protective layer to form a nucleation layer, and forming a TiN layer over the nucleation layer,
    after the TiN layer is formed a second annealing operation is performed.

20. A method of manufacturing a semiconductor device including a field effect transistor, comprising:
    forming a first conductive layer over an underlying layer;
    forming a boron containing layer by introducing boron into the first conductive layer;
    forming an intermixed layer by applying a gas containing one or more elements that are capable of intermixing with the first conductive layer;
    forming a second conductive layer over the boron containing layer; and
    performing a wet etching operation using an aqueous solution containing $H_3PO_4$,
    wherein the intermixed layer is capable of being dissolved in the aqueous solution containing $H_3PO_4$.

* * * * *